United States Patent
Ogawa et al.

(10) Patent No.: US 10,734,218 B2
(45) Date of Patent: Aug. 4, 2020

(54) METHOD OF MANUFACTURING SEMICONDUCTOR DEVICE, SUBSTRATE PROCESSING APPARATUS, AND RECORDING MEDIUM

(71) Applicant: KOKUSAI ELECTRIC CORPORATION, Tokyo (JP)

(72) Inventors: Arito Ogawa, Toyama (JP); Atsuro Seino, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/133,773

(22) Filed: Sep. 18, 2018

(65) Prior Publication Data
US 2019/0019673 A1    Jan. 17, 2019

Related U.S. Application Data

(63) Continuation of application No. PCT/JP2016/060263, filed on Mar. 29, 2016.

(51) Int. Cl.
| | |
|---|---|
| *H01L 21/02* | (2006.01) |
| *C23C 16/36* | (2006.01) |
| *C23C 16/455* | (2006.01) |
| *C23C 16/34* | (2006.01) |
| *H01L 21/768* | (2006.01) |

(Continued)

(52) U.S. Cl.
CPC ........ *H01L 21/02153* (2013.01); *C23C 16/32* (2013.01); *C23C 16/325* (2013.01);
(Continued)

(58) Field of Classification Search
CPC ......... H01L 21/02153; H01L 21/76829; H01L 21/285; H01L 21/02208; C23C 16/347; C23C 16/52; C23C 16/345; C23C 16/325
See application file for complete search history.

(56) References Cited

U.S. PATENT DOCUMENTS

| | | | |
|---|---|---|---|
| 6,287,965 B1 * | 9/2001 | Kang ..................... | C23C 16/34 257/E21.021 |
| 2003/0148605 A1 | 8/2003 | Shimogaki et al. | |

(Continued)

FOREIGN PATENT DOCUMENTS

| | | |
|---|---|---|
| JP | 2001-144032 A | 5/2001 |
| JP | 2003-226972 A | 8/2003 |

(Continued)

OTHER PUBLICATIONS

International Search Report, PCT/JP2016/060263, dated Apr. 26, 2016, 5pgs.

(Continued)

*Primary Examiner* — Syed I Gheyas
(74) *Attorney, Agent, or Firm* — Volpe and Koenig, P.C.

(57) ABSTRACT

There is provided a process of forming a film containing a metal element, an additional element different from the metal element and at least one of nitrogen and carbon on a substrate by performing a cycle a predetermined number of times, the cycle including non-simultaneously performing: (a) supplying a first precursor gas containing the metal element and a second precursor gas containing the additional element to the substrate so that supply periods of the first precursor gas and the second precursor gas at least partially overlap with each other; and (b) supplying a reaction gas containing the at least one of nitrogen and carbon to the substrate.

10 Claims, 12 Drawing Sheets

(51) Int. Cl.
   *H01L 21/3205* (2006.01)
   *H01L 21/285* (2006.01)
   *C23C 16/32* (2006.01)
   *C23C 16/52* (2006.01)

(52) U.S. Cl.
   CPC ............ *C23C 16/34* (2013.01); *C23C 16/345* (2013.01); *C23C 16/347* (2013.01); *C23C 16/36* (2013.01); *C23C 16/45531* (2013.01); *C23C 16/45546* (2013.01); *C23C 16/45551* (2013.01); *C23C 16/52* (2013.01); *H01L 21/02208* (2013.01); *H01L 21/28562* (2013.01); *H01L 21/32051* (2013.01); *H01L 21/76829* (2013.01); *H01L 21/76843* (2013.01)

(56) References Cited

U.S. PATENT DOCUMENTS

| | | | | |
|---|---|---|---|---|
| 2005/0271812 | A1* | 12/2005 | Myo | C23C 16/0272 427/248.1 |
| 2007/0237699 | A1* | 10/2007 | Clark | C23C 16/308 423/263 |
| 2013/0252439 | A1 | 9/2013 | Hirose et al. | |
| 2015/0303051 | A1 | 10/2015 | Takeda | |
| 2016/0079070 | A1 | 3/2016 | Ogawa et al. | |

FOREIGN PATENT DOCUMENTS

| | | |
|---|---|---|
| JP | 2007-537360 A | 12/2007 |
| JP | 2013-147708 A | 8/2013 |
| JP | 2013-225660 A | 10/2013 |
| JP | 2015-207591 A | 11/2015 |
| JP | 2016-034043 A | 3/2016 |
| KR | 10-1316056 B1 | 10/2013 |

OTHER PUBLICATIONS

Japanese Office Action dated Jun. 25, 2019 for the Japanese Patent Application No. 2018-507911.

Korean Office Action dated Sep. 5, 2019 for the Korean Patent Application No. 10-2018-7026945.

* cited by examiner

FIG. 12A

|  | Ti(at%) | N(at%) | Si(at%) | Cl(at%) | Resistivity (μΩcm) |
|---|---|---|---|---|---|
| Example 1 | 28.9 | 51.2 | 19.7 | 0.23 | 1278.5 |
| Comparative Example 1a | 27.2 | 51.7 | 20.8 | 0.38 | 2061.0 |
| Comparative Example 1b | 26.7 | 53.5% | 19.4 | 0.45 | 2111.5 |

FIG. 12B

|  | SiH₄ continuous supply time | Ti (at%) | N (at%) | Si (at%) | Cl (at%) |
|---|---|---|---|---|---|
| Example 2a |  | 44.3 | 50.7 | 4.86 | 0.11 |
| Example 2b | 6sec(0.025L) | 38.4 | 50.5 | 10.9 | 0.21 |
| Example 2c | 10sec(0.0375L) | 32.9 | 51.3 | 15.6 | 0.20 |
| Example 2d | 16sec(0.06L) | 28.9 | 51.2 | 19.7 | 0.23 |
| Comparative Example 2 |  | 49.5 | 49.8 |  | 0.7 |

METHOD OF MANUFACTURING SEMICONDUCTOR DEVICE, SUBSTRATE PROCESSING APPARATUS, AND RECORDING MEDIUM

CROSS-REFERENCE TO RELATED APPLICATION(S)

This application is a Bypass Continuation Application of PCT international Application No. PCT/JP2016/060263, filed on Mar. 29, 2016, the entire contents of which are incorporated herein by reference.

TECHNICAL FIELD

The present disclosure relates to a method of manufacturing a semiconductor device, a substrate processing apparatus, and a recording medium.

BACKGROUND

As one of processes of manufacturing a semiconductor device, a film-forming process for forming a conductive metal film, for example, a film (W film) containing tungsten (W), on a substrate is performed in some cases. The W film may be formed, for example, by alternately performing the supply of a tungsten hexafluoride ($WF_6$) gas to the substrate and the supply of a disilane ($Si_2H_6$) gas to the substrate a predetermined number of times (see, e.g., Patent Document 1).

In the case where a metal film is formed using a fluorine (F)-containing gas such as a $WF_6$ gas or the like, there is a possibility that F may remain in the metal film thus formed. When a thermal diffusion step or the like is performed thereafter, the F remaining in the metal film diffuses toward a silicon oxide film ($SiO_2$ film) or the like as a base formed in advance on the substrate. This may deteriorate the performance of a semiconductor device. Therefore, before the formation of the metal film, a process of forming a titanium nitride film (TiN film) or the like on the base as a diffusion suppressing film (barrier film) for suppressing diffusion of F may be performed in some cases.

The present disclosure provides some embodiments of a technique for improving the characteristics of a barrier film formed on a substrate.

SUMMARY

According to one embodiment of the present disclosure, there is provided a technique, including: a process of forming a film containing a metal element, an additional element different from the metal element, and at least one of nitrogen and carbon on a substrate by performing a cycle a predetermined number of times, the cycle including non-simultaneously performing: (a) supplying a first precursor gas containing the metal element and a second precursor gas containing the additional element to the substrate so that supply periods of the first precursor gas and the second precursor gas at least partially overlap with each other; and (b) supplying a reaction gas containing the at least one of nitrogen and carbon to the substrate.

According to the present disclosure, it is possible to improve the characteristics of a barrier film formed on a substrate.

BRIEF DESCRIPTION OF DRAWINGS

FIGS. 12A and 12B are views showing the compositions of films formed in Examples and Comparative Examples.

DETAILED DESCRIPTION

One Embodiment of the Present Disclosure

One embodiment of the present disclosure will now be described with reference to FIGS. 1 to 3.

(1) Configuration of Substrate Processing Apparatus

Figure 1:
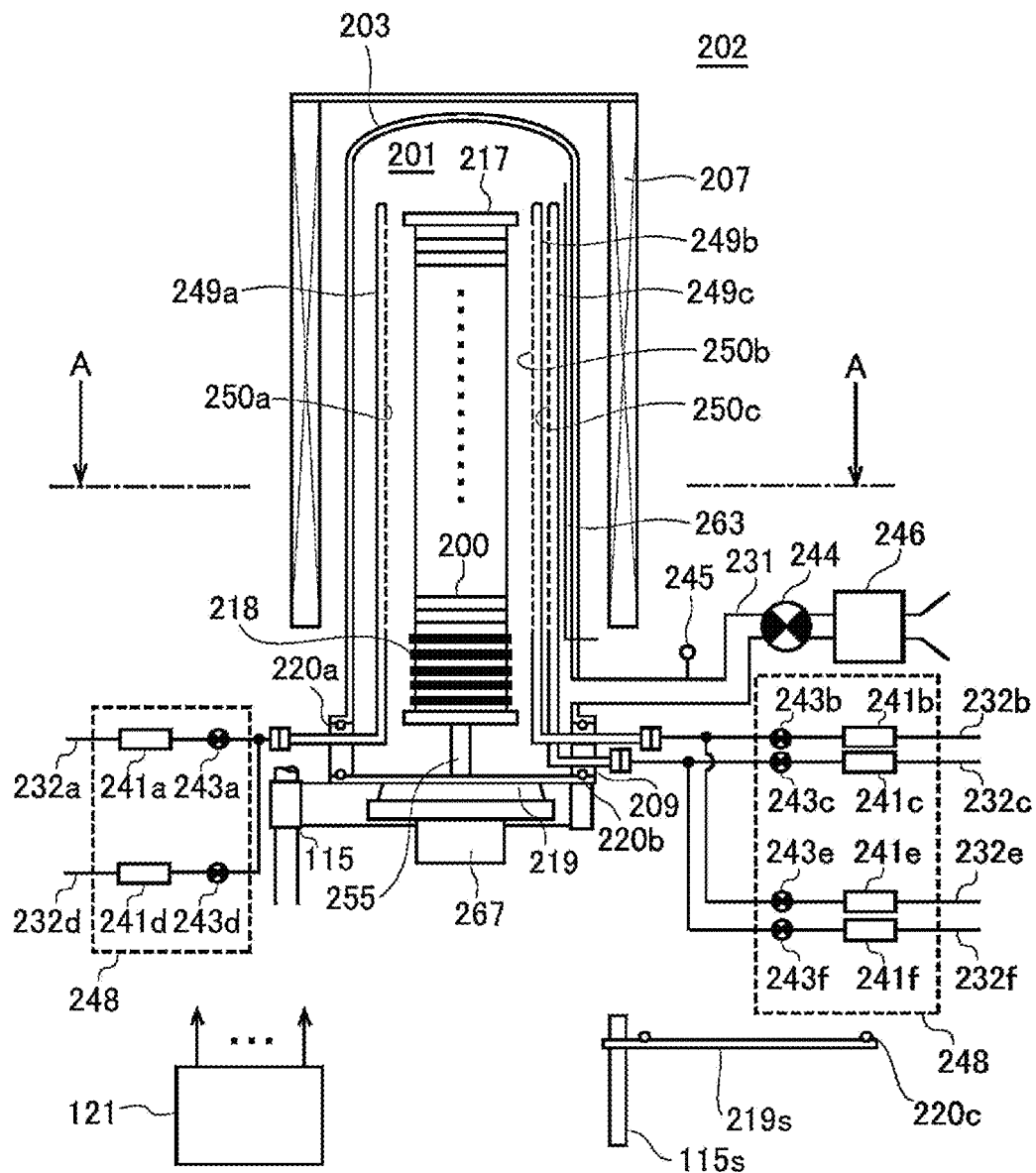
FIG. 1 is a schematic configuration view of a vertical process furnace of a substrate processing apparatus suitably used in one embodiment of the present disclosure, in which a portion of the process furnace is shown in a vertical cross section.

As illustrated in FIG. 1, a process furnace 202 includes a heater 207 as a heating mechanism (temperature adjustment part). The heater 207 has a cylindrical shape and is supported by a holding plate so as to be vertically installed. The heater 207 also functions as an activation mechanism (an excitation part) configured to thermally activate (excite) a gas.

A reaction tube 203 is disposed inside the heater 207 in a concentric relationship with the heater 207. The reaction tube 203 is made of a heat resistant material such as, e.g., quartz ($SiO2$), silicon carbide (SiC) or the like and has a cylindrical shape with its upper end closed and its lower end opened. A manifold 209 is disposed below the reaction tube 203 in a concentric relationship with the reaction tube 203. The manifold 209 is made of metal, e.g., stainless steel (SUS), and has a cylindrical shape with its upper and lower ends opened. The upper end of the manifold 209 engages with the lower end of the reaction tube 203. The manifold 209 is configured to support the reaction tube 203. An O-ring 220a as a seal member is provided between the manifold 209 and the reaction tube 203. The reaction tube 203 is vertically installed just like the heater 207. A process container (reaction container) is mainly constituted by the reaction tube 203 and the manifold 209. A process chamber 201 is formed in a hollow cylindrical portion of the processing vessel. The process chamber 201 is configured to accommodate a plurality of wafers 200 as substrates.

In the process chamber 201, nozzles 249a to 249c are installed so as to penetrate the side wall of the manifold 209. Gas supply pipes 232a to 232c are connected to the nozzles 249a to 249c, respectively.

Mass flow controllers (MFCs) 241a to 241c, which are flow rate controllers (flow rate control parts), and valves 243a to 243c, which are opening/closing valves, are installed in the gas supply pipes 232a to 232c sequentially from the corresponding upstream sides, respectively. Gas supply pipes 232d to 232f, which supply an inert gas, are respectively connected to the gas supply pipes 232a to 232c on the downstream side of the valves 243a to 243c. MFCs 241d to 241f and valves 243d to 243f are installed in the gas supply pipes 232d to 232f sequentially from the corresponding upstream sides, respectively.

Figure 2:
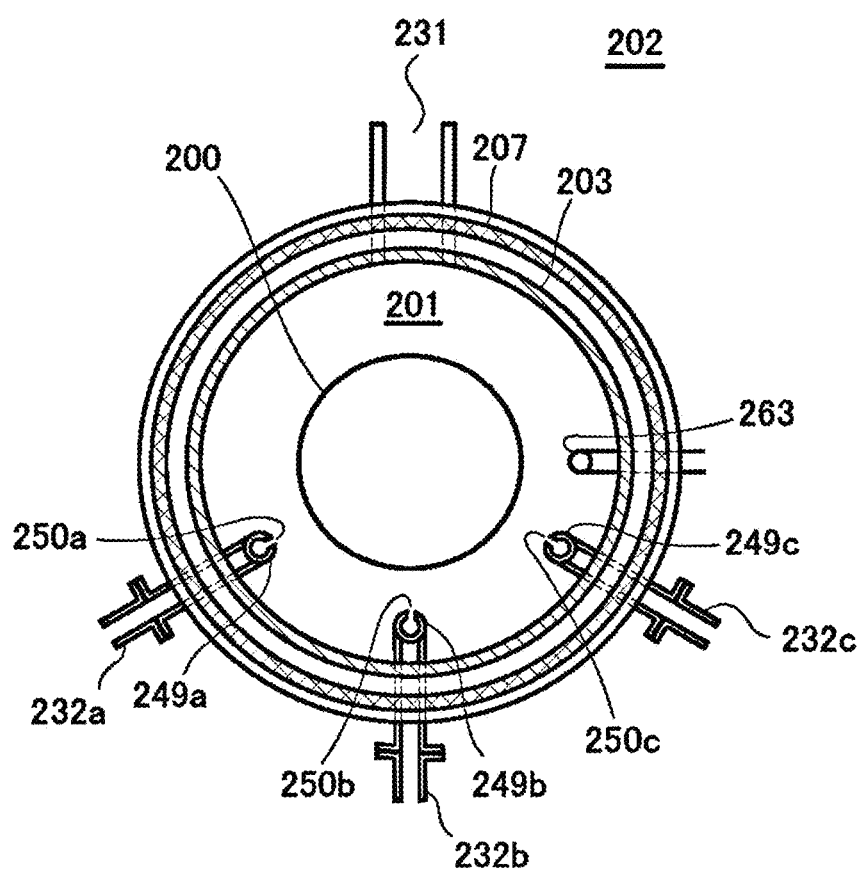
FIG. 2 is a schematic configuration view of a vertical process furnace of a substrate processing apparatus suitably used in one embodiment of the present disclosure, in which a portion of the process furnace is shown as a sectional view taken along line A-A in FIG. 1.

As illustrated in FIG. 2, the nozzles 249a to 249c are respectively disposed in a space with an annular plan-view shape between the inner wall of the reaction tube 203 and the wafers 200 such that the nozzles 249a to 249c extend upward along a stacking direction of the wafers 200 from a lower portion of the inner wall of the reaction tube 203 to an upper portion thereof. Specifically, the nozzles 249a to 249c are respectively installed on a lateral side of a wafer arrangement region in which the wafers 200 are arranged, namely in a region which horizontally surrounds the wafer arrangement region, so as to extend along the wafer arrangement region. Gas supply holes 250a to 250c for supplying a gas are respectively formed on the side surfaces of the nozzles 249a to 249c. The gas supply holes 250a to 250c are opened toward the center of the reaction tube 203 and are capable of supplying a gas toward the wafers 200. The gas supply holes 250a to 250c may be formed in a plural number between the lower portion of the reaction tube 203 and the upper portion thereof.

As described above, in the present embodiment, a gas is transferred through the nozzles 249a to 249c, which are disposed in a vertically-elongated space with an annular plan-view shape, i.e., a cylindrical space, defined by the inner surface of the side wall of the reaction tube 203 and the end portions (peripheral edge portions) of the wafers 200 arranged inside the reaction tube 203. The gas is initially injected into the reaction tube 203, near the wafers 200, through the gas supply holes 250a to 250c formed in the nozzles 249a to 249c. Accordingly, the gas supplied into the reaction tube 203 mainly flows in the reaction tube 203 in a direction parallel to the surfaces of the wafers 200, i.e., in a horizontal direction. With this configuration, the gas may be uniformly supplied to the respective wafers 200. The gas flowing on the surfaces of the wafers 200 flows toward an exhaust port, i.e., the exhaust pipe 231 which will be described later. The flow direction of the gas is not limited to the vertical direction but may be appropriately decided depending on the position of the exhaust port.

From the gas supply pipe 232a, a first precursor gas, for example, a Ti-containing gas containing titanium (Ti) as a metal element is supplied into the process chamber 201 via the MFC 241a, the valve 243a and the nozzle 249a. As the Ti-containing gas, it may be possible to use, for example, a gas containing a substance which contains at least one halogen element selected from the group consisting of chlorine (Cl), fluorine (F), bromine (Br) and iodine (I), i.e., a halide (titanium halide). As the gas containing titanium halide, it may be possible to use, for example, a tetrachlorotitanium ($TiCl_4$) gas containing Ti and Cl. The $TiCl_4$ gas acts as a Ti source. In the subject specification, when the term "precursor" is used, it may mean "a liquid precursor in a liquid state", "a precursor gas in a gaseous state", or both.

From the gas supply pipe 232b, a second precursor gas containing an additional element (dopant) different from the aforementioned metal element, for example, a Si-containing gas containing silicon (Si), is supplied into the process chamber 201 via the MFC 241b, the valve 243b and the nozzle 249b. As the Si-containing gas, it may be possible to use, for example, a substance containing hydrogen (H), i.e., a gas containing silicon hydride. As the gas containing silicon hydride, it may be possible to use, for example, a monosilane ($SiH_4$) gas. The $SiH_4$ gas acts as a Si source.

From the gas supply pipe 232c, a reaction gas containing at least one of nitrogen (N) and carbon (C), for example, an ammonia ($NH_3$) gas as an N-containing gas, is supplied into the process chamber 201 via the MFC 241c, the valve 243c and the nozzle 249c. The $NH_3$ gas acts as a nitriding agent, i.e., an N source.

From the gas supply pipes 232d to 232f, an inert gas, for example, a nitrogen ($N_2$) gas, is supplied into the process chamber 201 via the MFCs 241d to 241f, the valves 243d to 243f, the gas supply pipes 232a to 232c and the nozzles 249a to 249c.

A first precursor gas supply system is mainly constituted by the gas supply pipe 232a, the MFC 241a and the valve 243a. A second precursor gas supply system is mainly constituted by the gas supply pipe 232b, the MFC 241b and the valve 243b. A reaction gas supply system is mainly constituted by the gas supply pipe 232c, the MFC 241c and the valve 243c. In addition, an inert gas supply system is mainly constituted by the gas supply pipes 232d to 232f, the MFCs 241d to 241f and the valves 243d to 243f.

Either or all of the above-described various supply systems may be configured as an integrated supply system 248 in which the valves 243a to 243f, the MFCs 241a to 241f and the like are integrated. The integrated supply system 248 is connected to each of the gas supply pipes 232a to 232f and is configured so that the operation of supplying various gases into the gas supply pipes 232a to 232f, i.e., the opening/closing operation of the valves 243a to 243f, the flow rate adjustment operation by the MFCs 241a to 241f, and the like are controlled by a controller 121 which will be described later. The integrated supply system 248 is configured as a one-piece type integrated unit or a split type integrated unit and may be attached to and detached from the gas supply pipes 232a to 232f or the like on an integrated unit basis. The integrated supply system 248 is configured so that the maintenance, replacement, expansion or the like of the integrated supply system 248 can be performed on an integrated unit basis.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part), which detects the pressure inside the process chamber 201, and an auto pressure controller (APC) valve 244 as a pressure regulator (pressure regulation part). The APC valve 244 is configured so that the vacuum exhaust of the interior of the process chamber 201 and the vacuum exhaust stop can be performed by opening and closing the APC valve 244 while operating the vacuum pump 246 and so that the pressure inside the process chamber 201 can be regulated by adjusting the opening degree of the APC valve 244 based on the pressure information detected by the pressure sensor 245 while operating the vacuum pump 246. An exhaust system is mainly constituted by the exhaust pipe 231, the APC valve 244 and the pressure sensor 245. The vacuum pump 246 may be included in the exhaust system.

A seal cap 219, which serves as a furnace opening cover configured to hermetically seal a lower end opening of the manifold 209, is installed under the manifold 209. The seal cap 219 is made of metal such as, e.g., stainless steel or the like, and is formed in a disc shape. An O-ring 220*b*, which is a seal member making contact with the lower end portion of the manifold 209, is provided on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 215 is configured to load and unload the boat 217 into and from the process chamber 201 by moving the seal cap 219 up and down. The boat elevator 115 is configured as a transfer device (transfer mechanism) which transfers the boat 217, i.e., the wafers 200, into and out of the process chamber 201. Furthermore, a shutter 219*s* as a furnace opening cover, which is capable of hermetically sealing the lower end opening of the manifold 209 while lowering the seal cap 219 by the boat elevator 115, is installed under the manifold 209. The shutter 219*s* is made of metal such as, e.g., stainless steel or the like, and is formed in a disc shape. An O-ring 220*c* as a seal member making contact with the lower end portion of the manifold 209 is installed on an upper surface of the shutter 219*s*. An opening/closing operation (a vertical movement operation or a rotational movement operation) of the shutter 219*s* is controlled by a shutter opening/closing mechanism 115*s*.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is to say, the boat 217 is configured to arrange the wafers 200 in a spaced-apart relationship. The boat 217 is made of a heat resistant material such as quartz or SiC. Heat insulating plates 218 made of a heat resistant material such as quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is formed in an L shape. The temperature sensor 263 is installed along the inner wall of the reaction tube 203.

Figure 3:
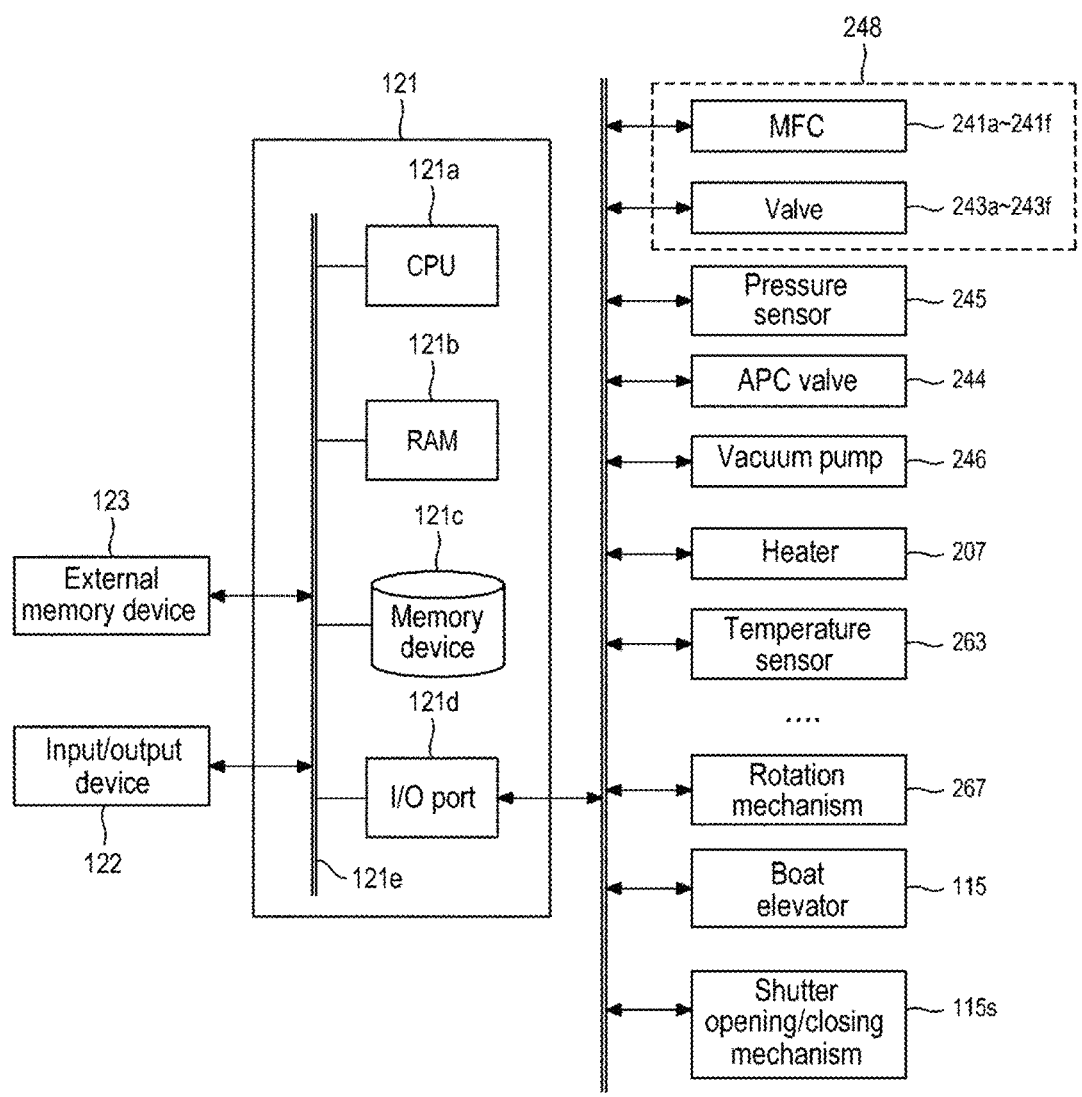
FIG. 3 is a schematic configuration view of a controller of a substrate processing apparatus suitably used in one embodiment of the present disclosure, in which a control system of a controller is shown as a block diagram.

As illustrated in FIG. 3, a controller 121, which is a control part (control means), may be configured as a computer including a central processing unit (CPU) 121*a*, a random access memory (RAM) 121*b*, a memory device 121*c*, and an I/O port 121*d*. The RAM 121*b*, the memory device 121*c* and the I/O port 121*d* are configured to exchange data with the CPU 121*a* via an internal bus 121*e*. An input/output device 122 formed of, for example, a touch panel or the like is connected to the controller 121.

The memory device 121*c* is configured by, for example, a flash memory, a hard disc drive (HDD), or the like. A control program for controlling operations of a substrate processing apparatus, or a process recipe, in which sequences and conditions of a film forming process to be described later are written, are readably stored in the memory device 121*c*. The process recipe functions as a program for causing the controller 121 to execute each sequence in the film forming process, which will be described later, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121*b* is configured as a memory area (work area) in which a program or data read by the CPU 121*a* is temporarily stored.

The I/O port 121*d* is connected to the MFCs 241*a* to 241*f*, the valves 243*a* to 243*f*, the pressure sensor 245, the APC valve 244, the vacuum pump 246, the temperature sensor 263, the heater 207, the rotation mechanism 267, the boat elevator 115, the shutter opening/closing mechanism 115*s*, and the like.

The CPU 121*a* is configured to read the control program from the memory device 121*c* and execute the same. The CPU 121*a* also reads the recipe from the memory device 121*c* according to an input of an operation command from the input/output device 122. In addition, the CPU 121*a* is configured to control, according to the contents of the recipe thus read, the flow rate adjusting operation of various kinds of gases by the MFCs 241*a* to 241*f*, the opening/closing operation of the valves 243*a* to 243*f*, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, the operation of opening and closing the shutter 219*s* with the shutter opening/closing mechanism 115*s*, and the like.

The controller 121 may be configured by installing, on the computer, the aforementioned program stored in an external memory device 123 (for example, a magnetic disc such as a hard disc or the like, an optical disc such as a CD or the like, a magneto-optical disc such as an MO or the like, or a semiconductor memory such as a USB memory or the like). The memory device 121*c* or the external memory device 123 is configured as a non-transitory computer-readable recording medium. Hereinafter, the memory device 121*c* and the external memory device 123 will be generally and simply referred to as a "recording medium." When the term "recording medium" is used herein, it may indicate a case of including only the memory device 121*c*, a case of including only the external memory device 123, or a case of including both the memory device 121*c* and the external memory device 123. Furthermore, the program may be supplied to the computer using a communication means such as the Internet or a dedicated line, instead of using the external memory device 123.

(2) Substrate Processing Process

A sequence example of forming a film on a substrate using the aforementioned substrate processing apparatus, which is one of the processes for manufacturing a semiconductor device, will be described below with reference to FIG. 4. In the following descriptions, the operations of the respective parts that constitute the substrate processing apparatus are controlled by the controller 121.

Figure 4:
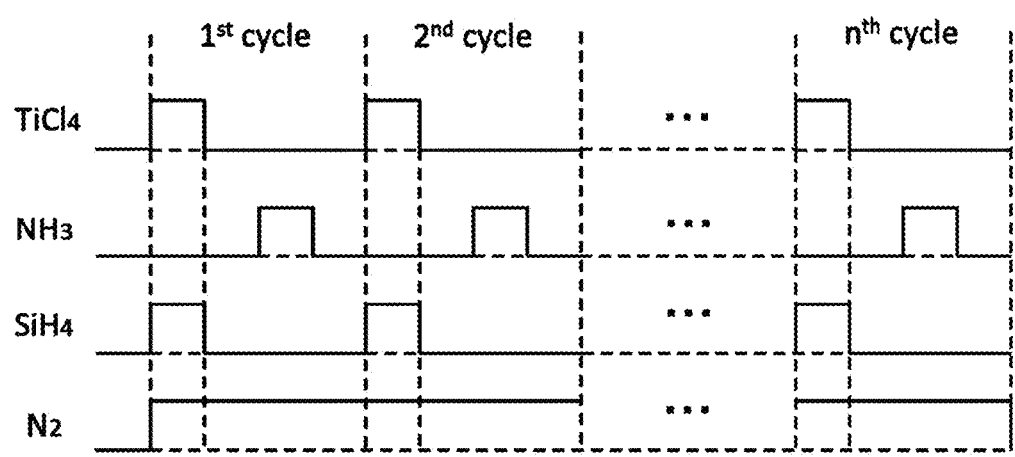
FIG. 4 is a view showing the timing of gas supply in one embodiment of the present disclosure.

In the basic sequence shown in FIG. 4, a titanium nitride film (TiSiN film) is formed as a film containing Ti, Si and N on a wafer 200 as a substrate by performing a cycle a predetermined number of times (n times where n is an integer of 1 or more), the cycle including non-simultaneously or asynchronously performing: step 1 of supplying a $TiCl_4$ gas and a $SiH_4$ gas to the wafer 200 so that supply periods of the $TiCl_4$ gas and the $SiH_4$ gas at least partially overlap with each other; and step 2 of supplying an $NH_3$ gas to the wafer 200. The TiSiN film may also be referred to as a Si-doped TiN film.

In the subject specification, the film-forming sequence described above may be denoted as follows for the sake of convenience. The same notation will be used in the description of other embodiments and so forth.

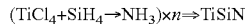

$(TiCl_4+SiH_4 \rightarrow NH_3) \times n \Rightarrow TiSiN$

When the term "wafer" is used herein, it may refer to "a wafer itself" or "a laminated body (aggregate) of a wafer and a predetermined layer or film formed on the surface of the wafer." That is to say, a wafer including a predetermined layer or film formed on its surface may be referred to as a wafer. In addition, when the phrase "a surface of a wafer" is used herein, it may refer to "a surface (exposed surface) of a wafer itself" or "a surface of a predetermined layer or film formed on a wafer", namely "an uppermost surface of the wafer as a laminated body."

Accordingly, in the present disclosure, the expression "a predetermined gas is supplied to a wafer" may mean that "a predetermined gas is directly supplied to a surface of a wafer itself" or that "a predetermined gas is supplied to a layer or film formed on a wafer, namely to an uppermost surface of a wafer as a laminated body." Furthermore, in the present disclosure, the expression "a predetermined layer (or film) is formed on a wafer" may mean that "a predetermined layer (or film) is directly formed on a surface of a wafer itself" or that "a predetermined layer (or film) is formed on a layer or film formed on a wafer, namely on an uppermost surface of a wafer as a laminated body."

In addition, when the term "substrate" is used herein, it may be synonymous with the term "wafer."

(Wafer Charging and Boat Loading)

When a plurality of wafers 200 are charged onto the boat 217 (wafer charging), the shutter 219s is moved by the shutter opening/closing mechanism 115s to open the lower end opening of the manifold 209 (shutter opening). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the manifold 209 through the O-ring 220b.

(Pressure Regulation and Temperature Adjustment Step)

The interior of the process chamber 201, namely the space in which the wafers 200 exist, is evacuated into a vacuum (evacuated into a reduced pressure) by the vacuum pump 246 so as to reach a desired pressure (desired degree of vacuum). In this case, the pressure inside the process chamber 201 is measured by the pressure sensor 245. The APC valve 244 is feedback-controlled based on the measured pressure information. The vacuum pump 246 may be continuously activated at least until the processing of the wafers 200 is completed. The wafers 200 in the process chamber 201 are heated by the heater 207 to a desired film forming temperature. In this case, the state of supplying electric power to the heater 207 is feedback-controlled based on the temperature information detected by the temperature sensor 263 such that the interior of the process chamber 201 has a desired temperature distribution. In addition, the heating of the interior of the process chamber 201 by the heater 207 may be continuously performed at least until the processing of the wafers 200 is completed. The rotation of the boat 217 and the wafers 200 by the rotation mechanism 267 is started. The rotation of the boat 217 and the wafers 200 by the rotation mechanism 267 may be continuously performed at least until the processing of the wafers 200 is completed.

(Film-Forming Step)

Thereafter, the following steps 1 and 2 are sequentially executed.

[Step 1]

In this step, a $TiCl_4$ gas and a $SiH_4$ gas are supplied to the wafer 200 inside the process chamber 201 so that supply periods of the $TiCl_4$ gas and the $SiH_4$ gas at least partially overlap with each other. In the sequence shown in FIG. 4, there is shown a case where the supply of these gases start at the same time and the supply of these gases stop at the same time.

Specifically, the valves 243a and 243b are opened, and the $TiCl_4$ gas and the $SiH_4$ gas are allowed to flow into the gas supply pipes 232a and 232b, respectively. The flow rates of the $TiCl_4$ gas and the $SiH_4$ gas are adjusted by the MFCs 241a and 241b, respectively. The $TiCl_4$ gas and the $SiH_4$ gas are supplied into the process chamber 201 via the nozzles 249a and 249b and are exhausted from the exhaust pipe 231. At this time, the $TiCl_4$ gas and the $SiH_4$ gas are simultaneously supplied to the wafer 200. At the same time, the valves 243d and 243e are opened, and the $N_2$ gas is allowed to flow into the gas supply pipes 232d and 232e, respectively. The flow rate of the $N_2$ gas is adjusted by the MFCs 241d and 241e. The $N_2$ gas is supplied into the process chamber 201 together with the $TiCl_4$ gas and the $SiH_4$ gas and is exhausted from the exhaust pipe 231. In order to prevent entry of the $TiCl_4$ gas and the $SiH_4$ gas into the nozzle 249c, the valve 243f is opened to allow the $N_2$ gas to flow into the gas supply pipe 232f. The $N_2$ gas is supplied into the process chamber 201 via the gas supply pipe 232c and the nozzle 249c and is exhausted from the exhaust pipe 231.

At this time, the pressure (film-forming pressure) inside the process chamber 201 is set to a predetermined pressure falling within a range of, for example, 1 to 3000 Pa. The temperature (film-forming temperature) of the wafer 200 is set to a predetermined temperature falling within a range of, for example, 300 to 600 degrees C., preferably 320 to 550 degrees C., more preferably 350 to 500 degrees C.

When the film-forming temperature is less than 300 degrees C., the activation of the $TiCl_4$ gas or the $SiH_4$ gas supplied into the process chamber 201 may become insufficient, thereby making it difficult to form a below-described first layer (a layer containing Ti and Si) on the wafer 200. By setting the film-forming temperature to 300 degrees C. or higher, it is possible to solve this problem. By setting the film-forming temperature to 320 degrees C. or higher, it is possible to further activate the gases supplied into the process chamber 201 and to efficiently form the first layer on the wafer 200. By setting the film-forming temperature to 350 degrees C. or higher, it is possible to more reliably obtain these effects.

When the film-forming temperature exceeds 600 degrees C., the $TiCl_4$ gas or the $SiH_4$ gas supplied into the process chamber 201 may be excessively decomposed, thereby making it difficult to form the first layer on the wafer 200. In addition, these gases may excessively react in the gas phase, thereby increasing the number of particles generated in the process chamber 201 and degrading the quality of the film-forming process. By setting the film-forming temperature to 600 degrees C. or lower, it is possible to properly suppress the decomposition of the gases and to form the first layer on the wafer 200. In addition, it is possible to suppress generation of particles in the process chamber 201. By setting the film-forming temperature to 550 degrees C. or lower, it is possible to more properly suppress decomposition of the gases and to more efficiently form the first layer on the wafer 200. In addition, it is possible to more reliably suppress generation of particles in the process chamber 201. By setting the film-forming temperature to 500 degrees C. or lower, it is possible to more reliably obtain these effects.

These conditions may be said to be conditions capable of properly suppressing the decomposition and reaction of the gases in the gas phase when supplying the $TiCl_4$ gas and the $SiH_4$ gas to the wafer 200 in the process chamber 201 so that the supply periods of the $TiCl_4$ gas and the $SiH_4$ gas at least partially overlap with each other.

Further, the supply flow rate of the $TiCl_4$ gas is set to a predetermined flow rate falling within a range of, for example, 0.01 to 2 slm, preferably 0.1 to 1.5 slm, more preferably 0.2 to 1 slm. The supply flow rate of the $SiH_4$ gas is set to a predetermined flow rate falling within a range of, for example, 0.001 to 2 slm, preferably 0.1 to 1.5 slm, more preferably 0.1 to 1 slm. When the supply of the $TiCl_4$ gas and the supply of the $SiH_4$ gas are overlapped, the flow rates of the $TiCl_4$ gas and the $SiH_4$ gas are adjusted so that the ratio of the flow rate of the $TiCl_4$ gas to the flow rate of the $SiH_4$ gas ($TiCl_4/SiH_4$ flow rate ratio) becomes a value falling within a range of, for example, 0.01 to 100, preferably 0.05 to 50, more preferably 0.1 to 10. The supply time of each of the $TiCl_4$ gas and the $SiH_4$ gas is set to a predetermined time falling within a range of, for example, 0.1 to 20 seconds.

If the supply flow rate of the $TiCl_4$ gas is less than 0.01 slm, if the supply flow rate of the $SiH_4$ gas exceeds 2 slm, or if the $TiCl_4/SiH_4$ flow rate ratio becomes less than 0.01, it may be difficult to perform the TiSiN film formation process. In addition, the amount of Ti contained in the TiSiN film, i.e., the ratio of the amount of Ti to the amount of Si (Ti/Si concentration ratio) may become too small and the conductivity of the TiSiN film may be insufficient. By setting the supply flow rate of the $TiCl_4$ gas to 0.01 slm or more, by setting the supply flow rate of the $SiH_4$ gas to 2 slm or less, or by setting the $TiCl_4/SiH_4$ flow rate ratio to 0.01 or more, it is possible to increase the deposition rate of the TiSiN film to a practical level. Furthermore, it is possible to optimize the composition of the TiSiN film and to impart sufficient conductivity to the TiSiN film. By setting the supply flow rate of the $TiCl_4$ gas to 0.1 slm or more, by setting the supply flow rate of the $SiH_4$ gas to 1.5 slm or less, or by setting the $TiCl_4/SiH_4$ flow rate ratio to 0.05 or more, it is possible to further increase the deposition rate of the TiSiN film and to further improve the conductivity of the TiSiN film. By setting the supply flow rate of the $TiCl_4$ gas to 0.2 slm or more, by setting the supply flow rate of the $SiH_4$ gas to 1 slm or less, or by setting the $TiCl_4/SiH_4$ flow rate ratio to 0.1 or more, it is possible to more reliably obtain the aforementioned effects.

If the supply flow rate of the $TiCl_4$ gas exceeds 2 slm, if the supply flow rate of the $SiH_4$ gas becomes less than 0.001 slm, or if the $TiCl_4/SiH_4$ flow rate ratio exceeds 100, the amount of Si contained in the TiSiN film, i.e., the ratio of the amount of Si to the amount of Ti (Si/Ti concentration ratio) may become too small, and the F diffusion suppressing effect to be exhibited by the TiSiN film (hereinafter also referred to as an F barrier effect) may be insufficient. By setting the supply flow rate of the $TiCl_4$ gas to 2 slm or less, by setting the supply flow rate of $SiH_4$ gas to 0.001 slm or more, or by setting the $TiCl_4/SiH_4$ flow rate ratio to 100 or less, it is possible to optimize the composition of the TiSiN film and to have the TiSiN film exhibit a sufficient F barrier effect. By setting the supply flow rate of the $TiCl_4$ gas to 1.5 slm or less, by setting the supply flow rate of the $SiH_4$ gas to 0.1 slm or more, or by setting the $TiCl_4/SiH_4$ flow rate ratio to 50 or less, it is possible to further optimize the composition of the TiSiN film and to further enhance the F barrier effect exhibited by the TiSiN film. By setting the supply flow rate of the $TiCl_4$ gas to 1 slm or less, or by setting the $TiCl_4/SiH_4$ flow rate ratio to 10 or less, it is possible to more reliably obtain the aforementioned effects.

The supply flow rate of the $N_2$ gas supplied from each gas supply pipe is set to a predetermined flow rate falling within a range of, for example, 0 to 10 slm.

By simultaneously supplying the $TiCl_4$ gas and the $SiH_4$ gas to the wafer 200 under the aforementioned conditions, a layer containing Ti and Si is formed as a first layer (initial layer) on the outermost surface of the wafer 200. This layer is a layer containing Ti and Si in a state of, for example, a Ti—Ti bond, a Ti—Si bond, a Si—Si bond or the like. The composition of the first layer, i.e., the ratio of the amount of Ti to the amount of Si contained in the layer (Ti/Si concentration ratio) may be controlled over a wide range by, for example, adjusting the $TiCl_4/SiH_4$ flow rate ratio.

In the case where the $TiCl_4$ gas and the $SiH_4$ gas are simultaneously supplied to the wafer 200 as in the present embodiment, as compared with a case where the $TiCl_4$ gas and the $SiH_4$ gas are non-simultaneously supplied, it is possible to reduce the amount of impurities such as Cl and H contained in the layer formed on the wafer 200. This is because if the $TiCl_4$ gas and the $SiH_4$ gas are simultaneously supplied under the above-mentioned conditions, it is possible to have these gases react with each other on the surface of the wafer 200 and to break the Ti—Cl bond and the Si—H bond contained in these gases. As a result, it is possible to suppress incorporation of Cl and H contained in these gases into the first layer, i.e., incorporation of impurities into the first layer. If Cl and H are incorporated, the resistivity of the TiSiN film becomes high (that is, the conductivity decreases). By suppressing the incorporation of Cl and H into the first layer, it is possible to obtain a film having a lower resistivity. Cl and H separated from Ti and Si react with each other to form gaseous byproducts such as hydrochloric acid (HCl), chlorine ($Cl_2$), hydrogen ($H_2$) and the like. Most of Cl and H are desorbed from the surface of the wafer 200 without being incorporated into the first layer and are removed from the inside of the process chamber 201.

However, the aforementioned desorption effect of impurities is affected by the $TiCl_4/SiH_4$ flow rate ratio. For example, when the $TiCl_4/SiH_4$ flow rate ratio is set to 1/1 and when these gases can be caused to react in a yield of 100% or more, it is theoretically possible to make zero the amount of Cl or the like incorporated into the first layer (the amount of Ti—Cl bonds or Si—H bonds) by the reaction of $TiCl_4 + SiH_4 \rightarrow Ti + Si + 4HCl$. In addition, even when the yield cannot be made 100%, by setting the $TiCl_4/SiH_4$ flow rate ratio to a small value (by increasing the flow rate percentage of the $SiH_4$ gas), it is possible to make zero the amount of Cl incorporated into the first layer. However, if the $TiCl_4/SiH_4$ flow rate ratio is set to be excessively small by increasing the flow rate of the $SiH_4$ gas and if the amount of Si contained in the TiSiN film is excessively increased, the conductivity of the TiSiN film may be lowered in some cases. For these reasons, the magnitude of the $TiCl_4/SiH_4$ flow rate ratio is subject to a certain limitation. As a result, a small amount of Ti—Cl bonds or Si—H bonds may be incorporated into the first layer formed in step 1. However, even in this case, by performing step 2 to be described later, it is possible to break the bonds incorporated into the first layer and to desorb Cl or the like from the first layer.

By simultaneously supplying the $TiCl_4$ gas and the $SiH_4$ gas into the process chamber 201 as in the present embodiment, it is possible to further improve the removal efficiency of HCl, which is a byproduct, from the inside of the process chamber 201. This is because, by simultaneously supplying these gases, i.e., by supplying not only the $TiCl_4$ gas but also the $SiH_4$ gas into the process chamber 201 where HCl is generated, reaction of $HCl+SiH_4 \rightarrow SiCl_4+H_2$ occurs and HCl disappears. By increasing the efficiency of removal of HCl from the inside of the process chamber 201 in this way, it is possible to avoid generation of an additional byproduct such as ammonium chloride ($NH_4Cl$) or the like in step 2 to be described later. As will be described later, the byproduct such as $NH_4Cl$ or the like may sometimes act as a steric hindrance to locally hinder the adsorption of the $TiCl_4$ gas or the $SiH_4$ gas onto the wafer 200. By increasing the efficiency of removal of HCl from the inside of the process chamber 201 and suppressing the generation of a byproduct such as $NH_4Cl$ or the like as in the present embodiment, it is possible to avoid local hindrance of formation of the first layer in the plane of the wafer 200. This makes it possible to improve the step coverage (coverage characteristics) and the in-plane film thickness uniformity of the TiSiN film formed on the wafer 200.

After the formation of the first layer, the valves 243a and 243b are closed and the supply of the $TiCl_4$ gas and the $SiH_4$ gas is stopped. At this time, the interior of the process chamber 201 is evacuated by the vacuum pump 246 while keeping the APC valve 244 open, whereby the $TiCl_4$ gas or the $SiH_4$ gas unreacted or contributed to the formation of the first layer or the byproducts, which remain inside the process chamber 201, are removed from the process chamber 201. At this time, the valves 243d to 243f are kept open and the supply of the $N_2$ gas into the process chamber 201 is maintained. The $N_2$ gas acts as a purge gas.

[Step 2]

After step 1 is completed, an $NH_3$ gas is supplied to the wafer 200 in the process chamber 201, i.e., the first layer formed on the wafer 200.

More specifically, the valve 243c is opened while keeping the valves 243a and 243b closed, and the $NH_3$ gas is allowed to flow into the gas supply pipe 232c. The opening and closing control of the valves 243d to 243f is controlled in the same manner as in step 1. The flow rate of the $NH_3$ gas is adjusted by the MFC 241c. The $NH_3$ gas is supplied into the process chamber 201 via the nozzle 249c and is exhausted from the exhaust pipe 231. At this time, the $NH_3$ gas is supplied to the wafer 200. The flow rate of the $N_2$ gas is adjusted by the MFC 241f. The $N_2$ gas is supplied together with the $NH_3$ gas into the process chamber 201 and is exhausted from the exhaust pipe 231.

At this time, the film-forming pressure is set to a predetermined pressure falling within a range of, for example, 1 to 3000 Pa. The supply flow rate of the $NH_3$ gas is set to a predetermined flow rate falling within a range of, for example, 0.1 to 30 slm, preferably 0.2 to 20 slm, more preferably 1 to 10 slm. The supply time of the $NH_3$ gas is set to a predetermined time falling within a range of, for example, 0.01 to 30 seconds, preferably 0.1 to 20 seconds, more preferably 1 to 15 seconds.

If the supply flow rate of the $NH_3$ gas becomes less than 0.1 slm or if the supply time of the $NH_3$ gas becomes less than 0.01 second, it may be impossible to modify (nitride) the first layer and it may be difficult form the TiSiN film on the wafer 200. By setting the supply flow rate of the $NH_3$ gas to 0.1 slm or more, or by setting the supply time of the $NH_3$ gas to 0.01 second or more, it becomes possible to modify the first layer and to form the TiSiN film on the wafer 200. By setting the supply flow rate of the $NH_3$ gas to 0.2 slm or more, or by setting the supply time of the $NH_3$ gas to 0.1 second or more, it is possible to promote the modifying of the first layer and to optimize the composition of the TiSiN film to be formed on the wafer 200. By setting the supply flow rate of the $NH_3$ gas to 1 slm or more, or by setting the supply time of the $NH_3$ gas to 1 second or more, it is possible to more reliably obtain these effects.

If the supply flow rate of the $NH_3$ gas exceeds 30 slm, or if the supply time of the $NH_3$ gas exceeds 30 seconds, the modifying (nitriding) of the first layer may become excessive and the characteristics of the TiSiN film formed on the wafer 200 may deteriorate. If the supply of the $NH_3$ gas is continued under such a condition that the amount of the $NH_3$ gas exceeds an amount at which the modifying of the first layer gets saturated, the gas cost may increase and the productivity may decrease. By setting the supply flow rate of the $NH_3$ gas to 30 slm or less or by setting the supply time of the $NH_3$ gas to 30 seconds or less, it is possible to properly restrict the modifying of the first layer and to avoid deterioration in characteristics of the TiSiN film formed on the wafer 200. In addition, it is possible to avoid an increase in gas cost and a decrease in productivity. By setting the supply flow rate of the $NH_3$ gas to 20 slm or less, or by setting the supply time of the $NH_3$ gas to 20 seconds or less, it is possible to optimize the modifying of the first layer and to improve the characteristic of the TiSiN film formed on the wafer 200. By setting the supply flow rate of the $NH_3$ gas to 10 slm or less, or by setting the supply time of the $NH_3$ gas to 15 seconds or less, it is possible to more reliably obtain these effects.

The supply flow rate of the $N_2$ gas supplied from each gas supply pipe is set to a predetermined flow rate falling within a range of, for example, 0.1 to 50 slm.

Other processing conditions are the same as the processing conditions in step 1.

By supplying the $NH_3$ gas into the process chamber 201 under the above-described conditions, a nitriding treatment is performed with respect to the first layer formed on the wafer 200 in step 1. That is, it is possible to incorporate N into the first layer by reacting and bonding Ti or Si contained in the first layer and N contained in the $NH_3$ gas. As a result, the first layer is changed (modified) to a second layer (TiSiN layer) containing Ti, Si and N. The first layer is a layer containing N in a state of a Ti—N bond, a Ti—Si—N bond, a Ti—N—Si bond or the like.

As described above, even when Ti—Cl bonds or Si—H bonds are incorporated in the first layer formed in step 1, these bonds can be broken by performing this step. Cl and H separated from Ti and Si react with each other to form byproducts such as HCl, $Cl_2$, $H_2$ and the like. These byproducts generated by performing this step are desorbed from the surface of the wafer 200 without being incorporated into the second layer and are exhausted from the process chamber 201. As a result, the second layer becomes a layer containing fewer impurities such as Cl and the like than the first layer, i.e., a high-quality layer having an extremely low impurity concentration.

After changing the first layer to the second layer, the valve 243c is closed and the supply of the NH$_3$ gas is stopped. Then, by the same processing procedure as in step 1, the NH$_3$ gas and/or its byproducts, which remain unreacted or contribute to the aforementioned reaction inside the process chamber 201, are removed from the inside of the process chamber 201.

[Performing a Predetermined Number of Times]

A TiSiN film having a predetermined composition and a predetermined film thickness can be formed on the wafer 200 by performing a cycle a predetermined number of times (n times), the cycle including non-simultaneously (alternately) performing steps 1 and 2 described above. It is preferable that the aforementioned cycle is repeated a plurality of times. That is, it is preferred that the thickness of the second layer formed by performing the aforementioned cycle once is set to be smaller than a desired film thickness and further that the aforementioned cycle is repeated a plurality of times until the thickness of a TiSiN film formed by laminating the second layer reaches the desired film thickness.

When performing the aforementioned cycle a plurality of times, HCl is generated as a byproduct every time when steps 1 and 2 are performed. This HCl may react with the NH$_3$ gas supplied to the wafer 200 in step 2, thereby generating an additional byproduct such as NH$_4$Cl or the like. As described above, NH$_4$Cl may act as a steric hindrance to locally hinder the adsorption of a gas onto the wafer 200. For example, when HCl generated as a byproduct reacts with Ti—NH$_x$ (where x is an integer of 1 or 2) which is present on the surface of the first layer by performing step 2, Ti—NH$_y$Cl (where y is an integer of 1 to 3) exists on the surface of the second layer. This Ti—NH$_y$Cl, i.e., ammonium chloride existing on the surface of the second layer, acts as a steric hindrance to locally hinder the adsorption of the TiCl$_4$ gas or the SiH$_4$ gas onto the surface of the wafer 200 in the next step 1. However, the generation of this steric hindrance can be suppressed by improving the removal efficiency of HCl from the inside of the process chamber 201 as in the present embodiment. That is, by simultaneously supplying the TiCl$_4$ gas and the SiH$_4$ gas into the process chamber 201 as in the present embodiment to improve the removal efficiency of HCl from the inside of the process chamber 201, it is possible to suppress generation of NH$_4$Cl which may become a steric hindrance.

Hereinafter, for reference, various reactions occurring when the TiCl$_4$ gas and the SiH$_4$ gas are simultaneously supplied into the process chamber 201 will be described. As shown below, NH$_4$Cl as a byproduct also acts as a nitriding agent to promote the formation of TiN from TiCl$_4$ or the formation of Si$_3$N$_4$ from SiH$_4$, i.e., a nitriding reaction. That is, NH$_4$Cl as a byproduct may also be regarded as a second reaction gas that assists the nitriding reaction caused by the NH$_3$ gas. However, these reactions are unlikely to occur when the TiCl$_4$ gas and the SiH$_4$ gas are non-simultaneously supplied into the process chamber 201. In the present embodiment, the TiCl$_4$ gas and the SiH$_4$ gas are simultaneously supplied into the process chamber 201. Therefore, as compared with a case where these gases are non-simultaneously supplied, it is possible to efficiently perform the nitriding process and to achieve high productivity.

$$2NH_4Cl+TiCl_4 \Rightarrow TiN+8HCl$$

$$4NH_4Cl+4SiH_4 \Rightarrow Si_3N_4+SiCl_4+16H_2$$

$$SiH_4+HCl \Rightarrow SiCl_4+4H_2$$

$$4NH_4Cl+3SiCl_4 \Rightarrow Si_3N_4+16HCl$$

(After-Purge and Atmospheric Pressure Restoration Step)

After the formation of the TiSiN film is completed, the N$_2$ gas is supplied into the process chamber 201 from the respective gas supply pipes 232d to 232f and is exhausted from the exhaust pipe 231. The N$_2$ gas acts as a purge gas. Thus, the interior of the process chamber 201 is purged, and the gas and the reaction byproduct remaining in the process chamber 201 are removed from the interior of the process chamber 201 (after-purge). Thereafter, the atmosphere inside the process chamber 201 is substituted with an inert gas (inert gas substitution), and the pressure inside the process chamber 201 is restored to an atmospheric pressure (atmospheric pressure restoration).

(Boat Unloading and Wafer Discharging)

The seal cap 219 is lowered by the boat elevator 115, and the lower end of the manifold 209 is opened. Then, the processed wafers 200 are unloaded from the lower end of the manifold 209 to the outside of the reaction tube 203 in a state in which the processed wafers 200 are supported by the boat 217 (boat unloading). The processed wafers 200 are taken out from the boat 217 (wafer discharging).

(3) Effects of the Present Embodiment

According to the present embodiment, one or more of the following effects may be obtained.

(a) Since the TiSiN film formed in the present embodiment contains Si therein, it exhibits a higher F barrier effect than a Si-free TiN film. Therefore, by forming the TiSiN film of the present embodiment between an SiO film and a W film, it possible to suitably use the TiSiN film as a barrier film for suppressing the diffusion of F from the W film to the SiO film. Further, even if the thickness of the TiSiN film formed in the present embodiment is set to be smaller than the film thickness of a Si-free TiN film, the TiSiN film exhibits an F barrier effect equal to or higher than that of the Si-free TiN film. Therefore, the TiSiN film can be suitably used in, for example, a highly-integrated NAND-type flash memory or the like.

(b) In step 1, by simultaneously supplying the TiCl$_4$ gas and the SiH$_4$ gas to the wafer 200, it is possible to have these gases react with each other on the surface of the wafer 200. As a result, as compared with a case of non-simultaneously supplying these gases, it is possible to efficiently perform the formation of the first layer and to improve the deposition rate of the TiSiN film.

(c) In step 1, the TiCl$_4$ gas and the SiH$_4$ gas are simultaneously supplied to the wafer 200 and are caused to react with each other on the surface of the wafer 200. Therefore, as compared with a case where these gases are non-simultaneously supplied, it is possible to reduce impurities such as Cl or the like contained in the first layer. As a result, the TiSiN film can be used as a high-quality film having an extremely low concentration of impurities such as Cl or the like and a high conductivity (low resistivity).

(d) In step 1, the TiCl$_4$ gas and the SiH$_4$ gas are simultaneously supplied to the wafer 200. Therefore, as compared with a case where these gases are non-simultaneously supplied, it is possible to efficiently remove HCl as a byproduct from the inside of the process chamber 201. This makes it possible to improve the film quality of the TiSiN film and to avoid the etching damage of members disposed inside the process chamber 201. In addition, by efficiently removing HCl from the inside of the process chamber 201, it is possible to suppress generation of NH$_4$Cl, which can act as a local steric hindrance, and to improve the step coverage and the in-plane film thickness of the TiSiN film.

(e) By simultaneously supplying the TiCl$_4$ gas and the SiH$_4$ gas to the wafer 200 in step 1, it is possible to reduce the number of steps per cycle from 3 to 2. As a result, it is possible to shorten the required time per cycle and to simplify the cycle procedure. This also makes it possible to improve the productivity of the film-forming process.

(f) In the film-forming sequence of the present embodiment in which the TiCl$_4$ gas and the SiH$_4$ gas are simultaneously supplied to the wafer 200 in step 1, the Ti/Si concentration ratio in the first layer, i.e., the composition of the TiSiN film, can be easily and extensively controlled by adjusting the TiCl$_4$/SiH$_4$ flow rate ratio. On the other hand, in a film-forming sequence in which the TiCl$_4$ gas and the SiH$_4$ gas are non-simultaneously supplied to the wafer 200, it is relatively difficult to extensively control the composition of the TiSiN film as in the present embodiment.

(g) The above-described effects can also be obtained when a Ti-containing gas other than the TiCl$_4$ gas is used as the first precursor gas, when a Si-containing gas other than the SiH$_4$ gas is used as the second precursor gas, or when an N-containing gas other than the NH$_3$ gas is used as the reaction gas.

For example, as the Ti-containing gas, in addition to the TiCl$_4$ gas, it may be possible to use a chlorotitanium-based gas such as a dichlorotitanium (TiCl$_2$) gas, a trichlorotitanium (TiCl$_3$) gas or the like, and a titanium-fluoride-based gas such as a titanium tetrafluoride (TiF$_4$) gas or the like, i.e., a titanium-halide-based gas.

For example, as the Si-containing gas, in addition to the SiH4 gas, it may be possible to use a silicon hydride gas such as a Si$_2$H$_6$ gas, a trisilane (Si$_3$H$_8$) gas or the like. As the Si-containing gas, it is preferable to use a gas which does not react with the Ti-containing gas in the gas phase under the above-mentioned processing conditions.

For example, as the N-containing gas, in addition to the NH$_3$ gas, it may be possible to use a hydrogen-nitride-based gas such as a diazene (N$_2$H$_2$) gas, a hydrazine (N$_2$H$_4$) gas, a N$_3$H$_8$ gas or the like.

For example, as the inert gas, in addition to the N$_2$ gas, it may be possible to use a rare gas such as an Ar gas, a He gas, a Ne gas, a Xe gas or the like.

(4) Modification

The sequence of the film forming process of the present embodiment is not limited to the one shown in FIG. 4, but may be modified as in the following modifications.

(Modification 1)

Figure 5A:
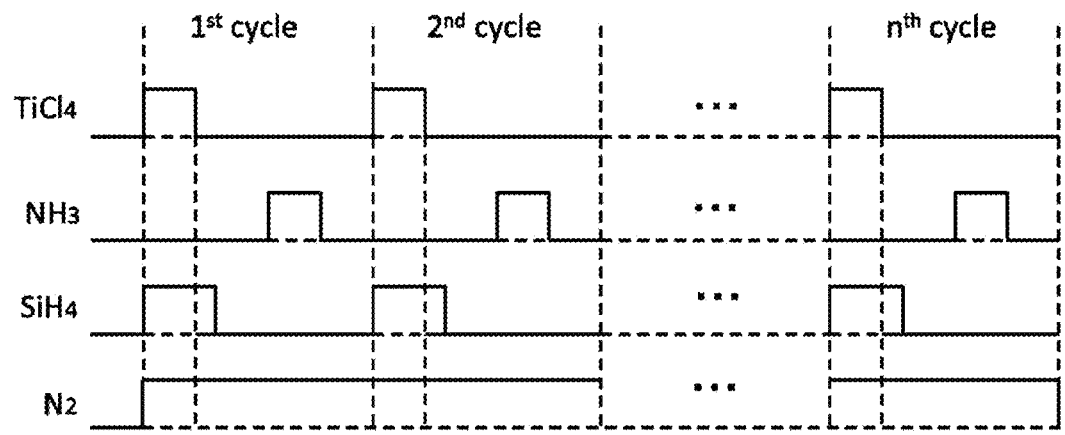
FIGS. 5A to 5C are views showing modifications of the timing of gas supply according to one embodiment of the present disclosure.

As shown in FIG. 5A, in step 1, the supply of the SiH$_4$ gas and the supply of the TiCl$_4$ gas may be started at the same time, and the supply of the SiH$_4$ gas may be stopped after stopping the supply of the TiCl$_4$ gas.

Also in this modification, the same effects as those of the film-forming sequence shown in FIG. 4 can be obtained.

Further, according to this modification, it is possible to increase the Si concentration of the TiSiN film formed on the wafer 200. This is because, in the case of stopping the supply of the two kinds of gases at the same time in step 1, an Si adsorption site may still exist (remain) on the surface of the wafer 200 or in the first layer at the time of stopping the gas supply. In this case, by continuing the supply of the SiH$_4$ gas even after stopping the supply of the TiCl$_4$ gas as in this modification, it is possible to add Si into the first layer and to further increase the Si concentration in the first layer. Even if the Si adsorption site does not exist in the first layer at the time when the supply of the two kinds of gases is stopped at the same time, by continuing the supply of the SiH$_4$ gas even after stopping the supply of the TiCl$_4$ gas as in this modification, it is possible to replace Cl existing on the surface of the first layer by Si and to further increase the Si concentration in the first layer. As a result, it is possible to further increase the Si concentration in the TiSiN film and to further enhance the F barrier effect exhibited by the TiSiN film. The present inventors have confirmed that if the supply of the TiCl$_4$ gas and the supply of the SiH$_4$ gas are stopped at the same time in step 1, the Si concentration in the first layer may become, for example, 3 to 5 at %, and further that by continuing the supply of the SiH$_4$ gas even after stopping the supply of the TiCl$_4$ gas, the Si concentration in the first layer may be increased to, for example, about 20 to 30 at % or more in some cases.

Moreover, according to this modification, it is possible to further reduce impurities such as Cl or the like in the first layer and to further improve the film quality of the TiSiN film. In addition, it is possible to more reliably remove HCl or the like from the inside of the process chamber 201 and to improve the quality of the film-forming process.

(Modification 2)

Figure 5B:
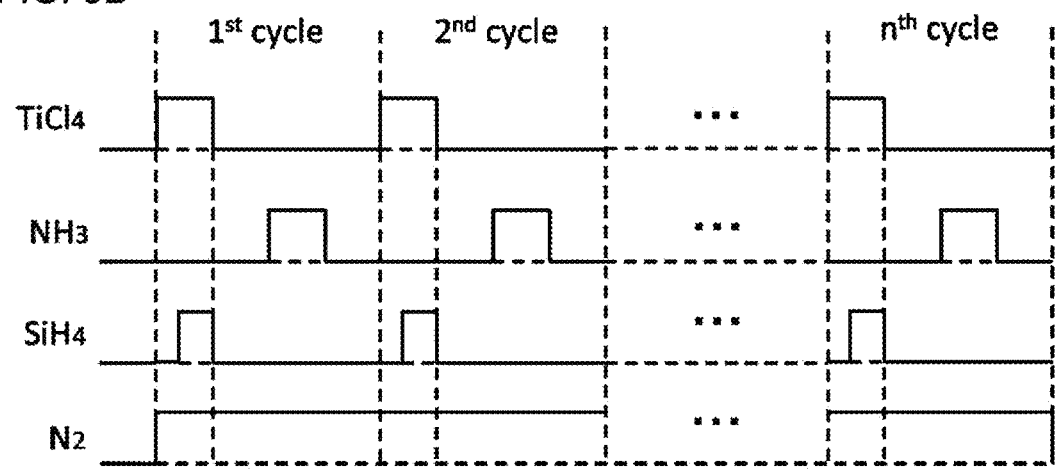

As shown in FIG. 5B, in step 1, the supply of the TiCl$_4$ gas may be started prior to the supply of the SiH$_4$ gas, and the supply of the TiCl$_4$ gas and the supply of the SiH$_4$ gas may be stopped at the same time.

Also in this modification, the same effects as those of the film-forming sequence shown in FIG. 4 can be obtained.

Further, according to this modification, the conductivity of the TiSiN film formed on the wafer 200 can be made uniform over the entire surface of the wafer 200. This is because if the supply of the TiCl$_4$ gas is started prior to the supply of the SiH$_4$ gas as in this modification, the layer containing Ti can be continuously (in a non-island shape and a non-mesh shape) formed with a substantially uniform thickness over the entire area in the plane of the wafer 200. According to this modification, by starting the supply of the SiH$_4$ gas after the surface of the wafer 200 is converted into such a state, it is possible to have Ti always exist at all locations on the wafer 200 to which the SiH$_4$ gas is supplied, and to form Ti—Si—N bonds or Ti—Si—Ti bonds at all locations in the plane of the wafer 200. In this manner, chemical bonds including Ti, which is a conductive metal element, are continuously formed over the entire surface of the wafer 200, whereby the conductivity of the TiSiN film can be made uniform over the entire surface of the wafer 200.

On the other hand, if the supply of the SiH$_4$ gas is started prior to the supply of the TiCl$_4$ gas in step 1, it is difficult to obtain the above-mentioned effects. This is because if the supply of the SiH$_4$ gas is started prior to the supply of the TiCl$_4$ gas in step 1, NH$_4$Cl as a byproduct formed in step 2 and remaining on the surface or the like of the wafer 200 may react with SiH$_4$ supplied in step 1, whereby Si$_3$N$_4$ having an insulating property may be formed discontinuously (in an island shape or a mesh shape) on the surface of the wafer 200. In this case, at the location where Si$_3$N$_4$ is formed, N is bonded to all the bonds of Si as in an N—Si—N bond. Thus, it is difficult to newly form a Ti—Si—N bond or a Ti—Si—Ti bond, i.e., a chemical bond containing Ti which is a conductive metal element. As a result, the conductivity of the TiSiN film may locally decrease in the plane of the wafer 200 in some cases.

Further, according to this modification, it is possible to appropriately suppress the amount of Si added to the TiSiN film. By suppressing the Si concentration in the TiSiN film to an appropriate low level, it is possible to improve the step coverage of the TiSiN film. The present inventors have confirmed that if the Si concentration in the TiSiN film is 20%, the step coverage may be about 75.2%, and further that, by setting the Si concentration in the TiSiN film to 15%, it is possible to increase the step coverage to 81.1% or more. This phenomenon can be similarly obtained in other modifications in which the exposure amount of the wafer 200 to the SiH$_4$ gas is suppressed.

(Modification 3)

Figure 5C:
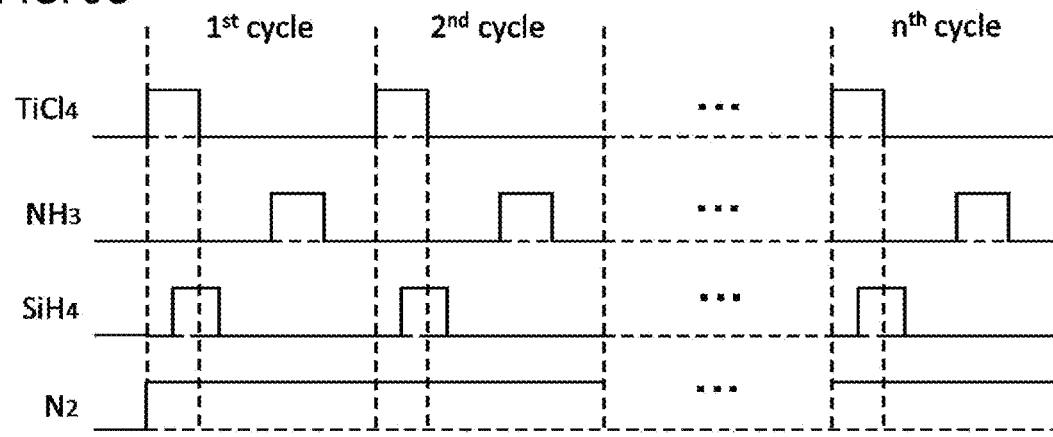

As shown in FIG. 5C, in step 1, the supply of the TiCl$_4$ gas may be started prior to the supply of the SiH$_4$ gas, and the supply of the TiCl$_4$ gas may be stopped before stopping the supply of the SiH$_4$ gas. Also in this modification, the same effects as those of the film-forming sequence shown in FIG. 4 and those of modifications 1 and 2 can be obtained.

(Modification 4)

Figure 6A:
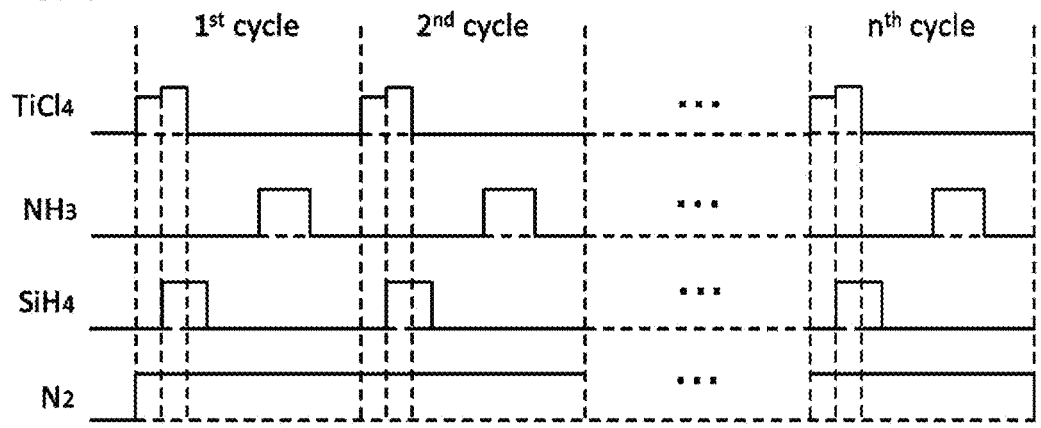
FIGS. 6A to 6C are views showing modifications of the timing of gas supply according to one embodiment of the present disclosure.

As shown in FIG. 6A, in step 1, the start and stop of supply of various gases may be controlled in the same manner as in modification 3. The supply flow rate of the TiCl$_4$ gas before starting the supply of the SiH$_4$ gas may be made smaller than the supply flow rate of the TiCl$_4$ gas after starting the supply of the SiH$_4$ gas.

Also in this modification, the same effects as those of the film-forming sequence shown in FIG. 4 and those of modification 3 can be obtained. Further, according to this modification, by setting the supply flow rate of the TiCl$_4$ gas in step 1 as described above, it is possible to properly suppress the amount of Ti contained in the first layer, i.e., to adequately secure the adsorption sites of Si in the first layer and to promote the addition of Si into the first layer. This makes it possible to increase the Si concentration in the TiSiN film and to further enhance the F barrier effect exhibited by the TiSiN film. Furthermore, by setting the supply flow rate of the TiCl$_4$ gas in Step 1 as described above, it is possible to further reduce the amount of Cl and H remaining in the first layer and to further suppress generation of a byproduct such as HCl or the like. Moreover, according to this modification, even if the execution period of the supply process of the SiH$_4$ gas to be continuously performed after stopping the supply of the TiCl$_4$ gas is made short, it is possible to sufficiently increase the Si concentration in the TiSiN film. This makes it possible to shorten the required time per cycle and to improve the productivity of the film-forming process.

(Modification 5)

Figure 6B:
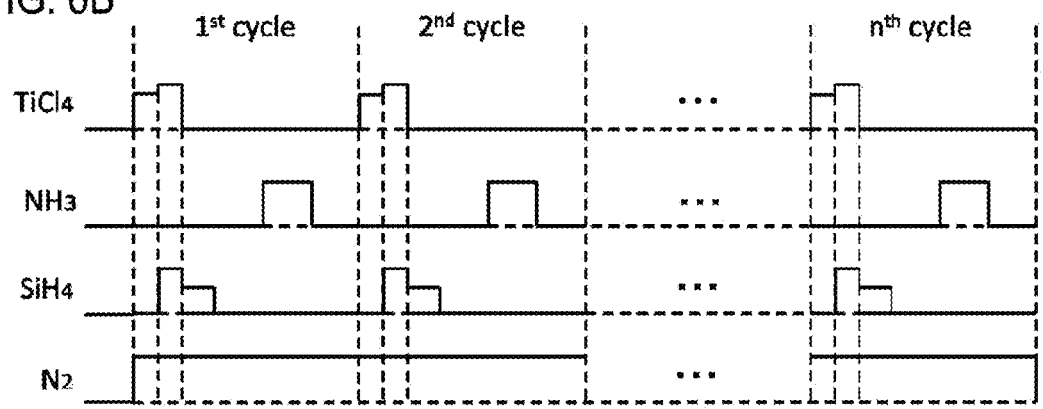

As shown in FIG. 6B, in step 1, the start and stop of supply of various gases may be controlled in the same manner as in modification 3. Then, the supply flow rate of the TiCl$_4$ gas may be controlled in the same manner as in modification 4. Furthermore, the supply flow rate of the SiH$_4$ gas after stopping the supply of the TiCl$_4$ gas may be smaller than the supply flow rate of the SiH$_4$ gas before stopping the supply of the TiCl$_4$ gas.

Also in this modification, the same effects as those of the film-forming sequence shown in FIG. 4 and those of modifications 3 and 4 can be obtained. Further, by setting the supply flow rate of the SiH$_4$ gas as described above, the addition of Si into the first layer is softly performed after stopping the supply of the TiCl$_4$ gas. This makes it possible to more uniformly add Si over the entire region of the first layer.

(Modification 6)

Figure 6C:
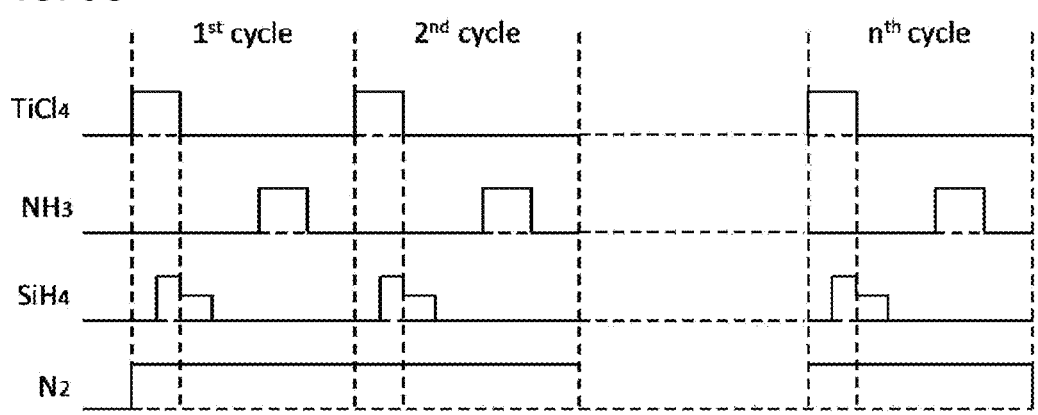

As shown in FIG. 6C, in step 1, the start and stop of supply of various gases may be controlled in the same manner as in modification 3. Then, the supply flow rate of the SiH$_4$ gas may be controlled in the same manner as in modification 5. Also in this modification, the same effects as those of the film-forming sequence shown in FIG. 4 and those of modification 3 can be obtained. In addition, similar to modification 5, the addition of Si into the first layer is softly performed after stopping the supply of the TiCl$_4$ gas. This makes it possible to more uniformly add Si over the entire region of the first layer.

(Modification 7)

Figure 7A:
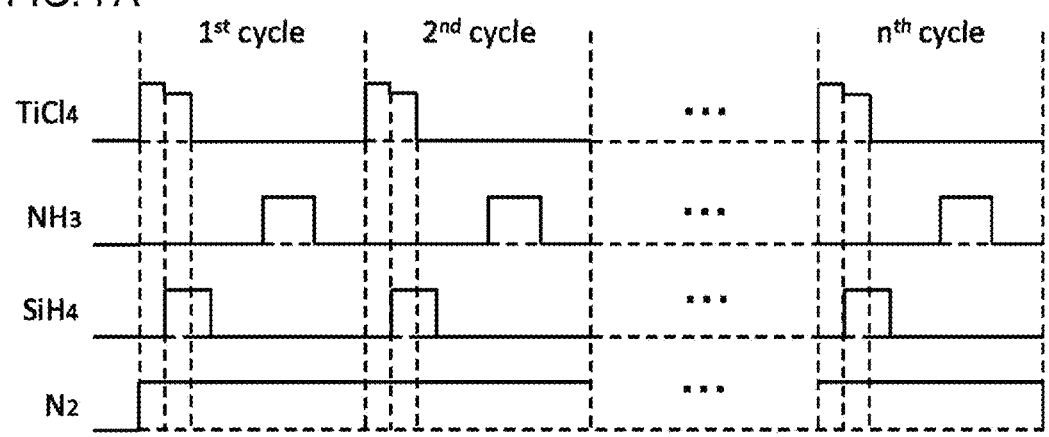
FIGS. 7A to 7C are views showing modifications of the timing of gas supply according to one embodiment of the present disclosure.

As shown in FIG. 7A, in step 1, the start and stop of supply of various gases may be controlled in the same manner as in modification 3. The supply flow rate of the TiCl$_4$ gas before starting the supply of the SiH$_4$ gas may be made larger than the supply flow rate of the TiCl$_4$ gas after starting the supply of the SiH$_4$ gas. Also in this modification, the same effects as those of the film-forming sequence shown in FIG. 4 and those of modification 3 can be obtained. In addition, by setting the supply flow rate of the TiCl$_4$ gas in step 1 as described above, the effects explained in modification 2 can be more reliably obtained.

(Modification 8)

Figure 7B:
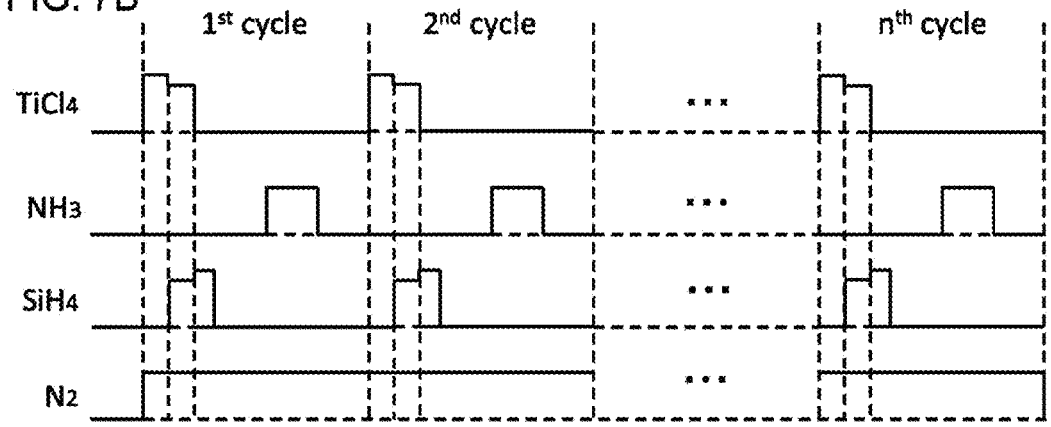

As shown in FIG. 7B, in step 1, the start and stop of supply of various gases may be controlled in the same manner as in modification 3. Then, the supply flow rate of the TiCl$_4$ gas may be controlled in the same manner as in modification 7. Further, the supply flow rate of the SiH$_4$ gas after stopping the supply of the TiCl$_4$ gas may be made larger than the supply flow rate of the SiH$_4$ gas before stopping the supply of the TiCl$_4$ gas. Also in this modification, the same effects as those of the film-forming sequence shown in FIG. 4 and those of modification 7 can be obtained. In addition, by setting the supply flow rate of the SiH$_4$ gas in step 1 as described above, the effects described in modification 1 can be more reliably obtained.

(Modification 9)

Figure 7C:
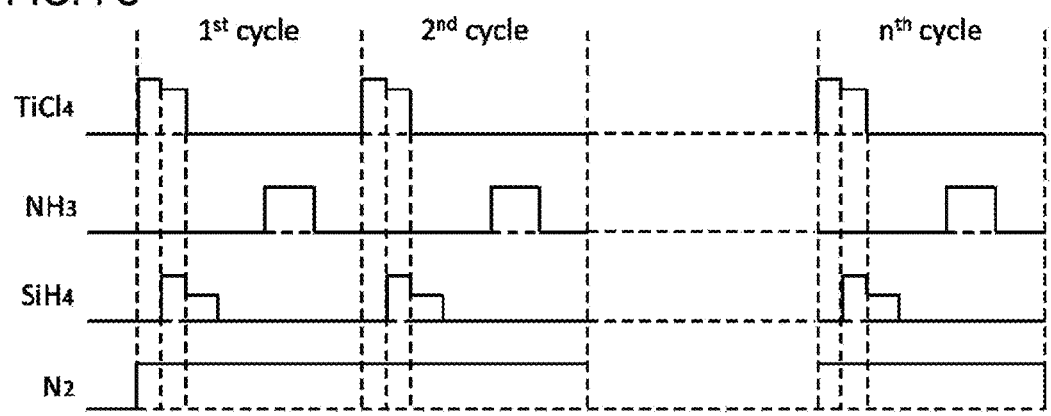

As shown in FIG. 7C, in step 1, the start and stop of supply of various gases may be controlled in the same manner as in modification 3. Then, the supply flow rate of the TiCl$_4$ gas may be controlled in the same manner as in modification 7, and the supply flow rate of the SiH$_4$ gas may be controlled in the same manner as in modification 5. Also in this modification, the same effects as those of the film-forming sequence shown in FIG. 4 and those of modifications 5 and 7 can be obtained.

(Modification 10)

Figure 8A:
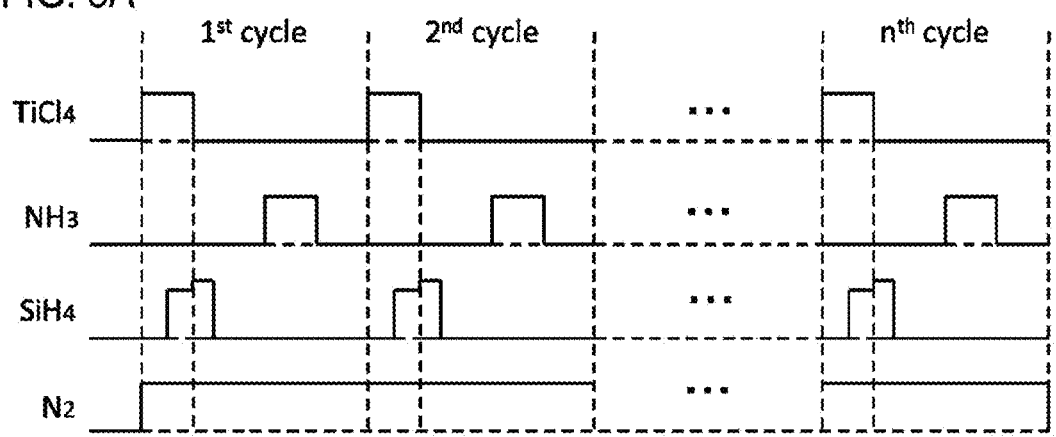
FIGS. 8A and 8B are views showing modifications of the timing of gas supply according to one embodiment of the present disclosure.

As shown in FIG. 8A, in step 1, the start and stop of supply of various gases may be controlled in the same manner as in modification 3. Then, the supply flow rate of the SiH$_4$ gas may be controlled in the same manner as in modification 8. Also in this modification, the same effects as those of the film-forming sequence shown in FIG. 4 and those of modification 3 can be obtained. In addition, by setting the supply flow rate of the SiH$_4$ gas in step 1 as described above, the effects described in modification 1 can be more reliably obtained.

(Modification 11)

Figure 8B:
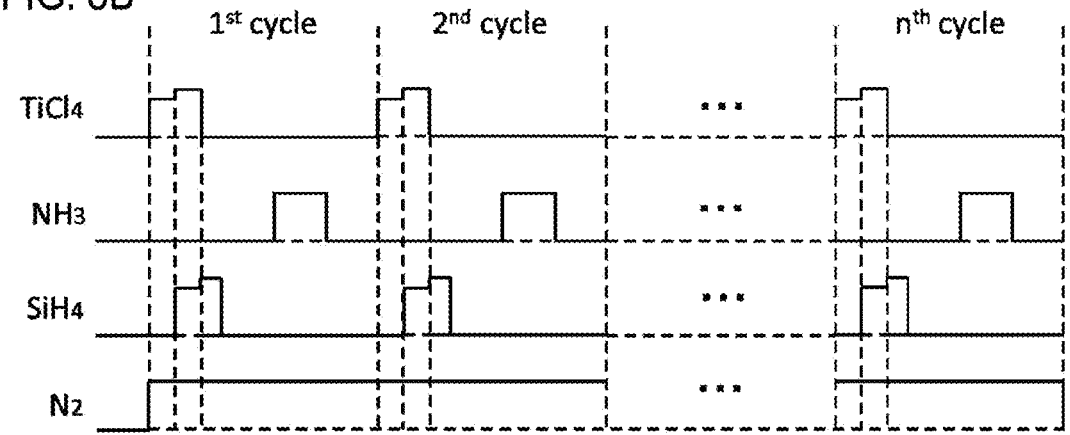

As shown in FIG. 8B, in step 1, the start and stop of supply of various gases may be controlled in the same manner as in modification 3. Then, the supply flow rate of the TiCl$_4$ gas may be controlled in the same manner as in modification 4, and the supply flow rate of the SiH$_4$ gas may be controlled in the same manner as in modification 8. Also in this modification, the same effects as those of the film-forming sequence shown in FIG. 4 and those of modifications 3, 4 and 8 can be obtained.

(Processing Conditions in Modifications)

In each of the modifications described above, the processing conditions for supplying the SiH$_4$ gas alone are as follows.

The pressure inside the process chamber 201 is set to a predetermined pressure falling within a range of, for example, 1 to 3000 Pa. Further, the supply flow rate of the SiH$_4$ gas is set to a predetermined flow rate falling within a range of, for example, 0.001 to 2 slm, preferably 0.05 to 1.5 slm, more preferably 0.1 to 1 slm. The supply time of the SiH$_4$ gas is set to a predetermined time falling within a range of, for example, 0.01 to 30 seconds. In addition, the supply flow rate of the N$_2$ gas supplied from each gas supply pipe is set to a predetermined flow rate falling within a range of, for example, 0 to 10 slm.

In each of the modifications described above, the processing conditions for supplying the TiCl$_4$ gas alone are as follows.

The pressure inside the process chamber 201 is set to a predetermined pressure falling within a range of, for example, 1 to 3000 Pa. The supply flow rate of the TiCl$_4$ gas is set to a predetermined flow rate falling within a range of, for example, 0.01 to 2 slm, preferably 0.1 to 1.5 slm, more preferably 0.2 to 1 slm. The supply time of the TiCl$_4$ gas is set to a predetermined time falling within a range of, for example, 0.1 to 30 seconds, preferably 0.5 to 20 seconds, more preferably 1 to 10 seconds. The supply flow rate of the N$_2$ gas supplied from each gas supply pipe is set to a predetermined flow rate falling within a range of, for example, 0.1 to 20 slm.

Other processing conditions are the same as those of the film-forming sequence shown in FIG. 4 described above. By setting the various processing conditions to fall within the above-mentioned range, the effects corresponding to the respective modifications can be properly obtained.

Other Embodiments of the Present Disclosure

The embodiment of the present disclosure has been concretely described above. However, the present disclosure is not limited to the above-described embodiment. Various changes may be made without departing from the spirit thereof.

For example, as in the film-forming sequence shown below, a hydrocarbon-based gas such as a propylene (C$_3$H$_6$) gas or the like, i.e., a C-containing gas, may be used as the reaction gas, and a titanium carbide film (TiSiC film) may be formed as the film containing Ti, Si and C on the wafer 200. Even in this case, the same effects as those of the above-described embodiment can be obtained. In addition, by doping C in the film, it becomes possible to lower the work function of the film.

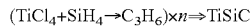

Further, for example, as in the film-forming sequences shown below, an amine-based gas such as triethylamine ((C$_2$H$_5$)$_3$N), abbreviation: TEA) or the like, or an organic hydrazine-based gas such as dimethyl hydrazine ((CH$_3$)$_2$N$_2$H$_2$, abbreviation: DMH) or the like, i.e., a gas containing N and C may be used as the reaction gas, and a titanium carbonitride film (TiSiCN film) may be formed as a film containing Ti, Si, C and N on the wafer 200. Alternatively, plural kinds of reaction gases may be combined to form a TiSiCN film on the wafer 200. Even in these cases, the same effects as those of the above-described embodiment can be obtained. In addition, by doping C in the film, it becomes possible to lower the work function of the film.

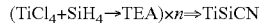

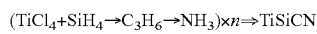

Further, for example, in the above-described embodiment and modifications, there has been described an example in which the film containing Ti as a metal element is formed on the substrate. However, the present disclosure is not limited to such an example. That is, the present disclosure may be suitably applied to a case where a film containing, in addition to Ti, a metal element such as zirconium (Zr), hafnium (Hf), niobium (Nb), tantalum (Ta), molybdenum (Mo), tungsten (W), yttrium (Y), lantern (La), strontium (Sr), aluminum (Al), chromium (Cr), vanadium (V), gallium (Ga) or the like is formed on a substrate. Moreover, the present disclosure may be suitably applied to a case where a film containing, in addition to Si, an additional element such as germanium (Ge), boron (B), arsenic (As), phosphorus (P), Al or the like is formed on a substrate.

Further, the present disclosure may be suitably applied to a case where, as in the film-forming sequences shown below, a film containing a semi-metal element such as Si, Ge, B or the like in place of a metal element is formed, i.e., a case where an insulating film instead of a conductive film is formed. In this case, as the first precursor gas, a halosilane precursor gas such as a tetrachlorosilane (SiCl$_4$) gas or the like may be used. As the reaction gas, in addition to the various reaction gases mentioned above, an O-containing gas (oxidizing agent) such as an oxygen (O$_2$) gas or the like may be used.

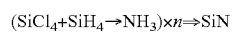

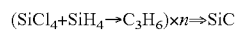

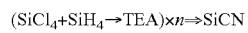

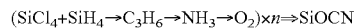

Further, for example, in step 1, while keeping the APC valve 244 closed, the TiCl$_4$ gas may be supplied into the depressurized process chamber 201 at once by flush flow. For example, a first tank (gas reservoir) configured as a pressurized container may be installed in the gas supply pipe 232a on the upstream side of the valve 243a. In step 1, while keeping the APC valve 244 closed, the high-pressure TiCl$_4$ gas filled in the first tank may be supplied into the process chamber 201 at once by flush flow. By supplying the TiCl$_4$ gas in this way, it is possible to shorten the required time period of step 1 and to improve the productivity of the film-forming process.

Further, for example, in step 2, while keeping the APC valve 244 closed, the NH$_3$ gas may be supplied into the depressurized process chamber 201 at once by flush flow. For example, a second tank (gas reservoir) configured as a pressurized container may be installed in the gas supply pipe 232c on the upstream side of the valve 243c. In step 2, while keeping the APC valve 244 closed, the high-pressure NH$_3$ gas filled in the second tank may be supplied into the process chamber 201 at once by flush flow.

By supplying the NH$_3$ gas in this manner, it is possible to shorten the required time period of step 2 and to improve the productivity of the film-forming process.

By supplying the NH$_3$ gas in this way, the byproducts existing in the process chamber 201 can be quickly discharged from the process chamber 201. As a result, it is possible to suppress incorporation of the byproducts into the TiSiN film and to improve the film quality of the TiSiN film. This is because HCl as a byproduct is generated by performing step 1 as described above and is also generated as Cl adsorbed to the surface of the first layer is replaced by N contained in the NH$_3$ gas when performing step 2. HCl as a byproduct may react with the NH$_3$ gas supplied in step 2 to generate new byproduct such as NH$_4$Cl or the like. On the other hand, by supplying the NH$_3$ gas by flush flow, HCl can be discharged from the process chamber 201 before a byproduct such as NH$_4$Cl or the like is newly generated. As a result, it is possible to suppress incorporation of NH$_4$Cl or the like into the TiSiN film.

Further, in the present embodiment, there has been described the case where the first precursor gas, the second precursor gas and the reaction gas are independently supplied into the process chamber 201 by using the three nozzles 249a to 249c. In the case where various gases are independently supplied using different nozzles in this manner, the nozzle 249a for supplying the first precursor gas and the nozzle 249b for supplying the second precursor gas are preferably disposed as close as possible to each other. With such a configuration, it is possible to efficiently mix the first precursor gas and the second precursor gas. As a result, the composition and film quality of the film formed on the wafer 200 can be made uniform throughout the plane of the wafer 200.

Further, in the present embodiment, there has been described the case where the first precursor gas, the second precursor gas and the reaction gas are independently supplied into the process chamber 201 by using the three nozzles 249a to 249c. However, the present disclosure is not limited to such an embodiment. For example, the nozzle 249a for supplying the first precursor gas and the nozzle 249b for supplying the second precursor gas may be used in common, whereby two nozzles may be provided in the process chamber 201. With such a configuration, it is possible to efficiently mix (premix) the first precursor gas and the second precursor gas in the nozzle. As a result, the composition and film quality of the film formed on the wafer 200 can be made uniform throughout the plane of the wafer 200.

Recipes used in substrate processing may be prepared individually according to the processing contents and may preferably be stored in the memory device 121c via a telecommunication line or the external memory device 123. Moreover, at the start of substrate processing, the CPU 121a may properly select an appropriate recipe from the recipes stored in the memory device 121c according to the processing contents. Thus, it is possible for one substrate processing apparatus to form films of different kinds, composition ratios, qualities and thicknesses with enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the above-described embodiment, an example in which a film is formed using a batch type substrate processing apparatus for processing a plurality of substrates at a time has been described. The present disclosure is not limited to the above-described embodiment, but may be suitably applied to a case where a film is formed using, for example, a single-wafer type substrate processing apparatus for processing one or several substrates at a time. Further, in the above-described embodiment, an example in which a film is formed using a substrate processing apparatus having a hot wall type process furnace has been described. The present disclosure is not limited to the above-described embodiment, but may be suitably applied to a case where a film is formed using a substrate processing apparatus having a cold wall type process furnace.

Figure 9:
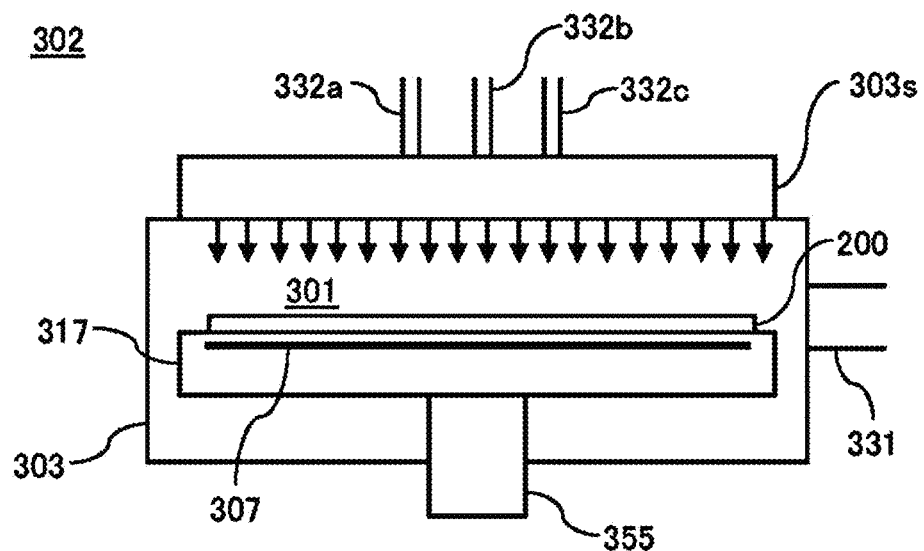
FIG. 9 is a schematic configuration view of a process furnace of a substrate processing apparatus suitably used in another embodiment of the present disclosure, in which a portion of the process furnace is shown in a vertical cross section.

For example, the present disclosure may also be suitably applied to a case where a film is formed by using a substrate processing apparatus provided with the process furnace 302 shown in FIG. 9. The process furnace 302 includes a process container 303 forming a process chamber 301, a shower head 303s for supplying a gas into the process chamber 301 in a shower shape, a support base 317 for supporting one or several wafers 200 in a horizontal posture, a rotation shaft 355 for supporting the support base 317 from below, and a heater 307 installed on the support base 317. Gas supply ports 332a to 332c are connected to the inlet of the shower head 303s. Gas supply systems similar to the first precursor gas supply system, the second precursor gas supply system and the reaction gas supply system of the above-described embodiment are connected to the gas supply ports 332a, 332b and 332c, respectively. A gas dispersion plate is installed in the outlet of the shower head 303s. An exhaust port 331 for exhausting the interior of the process chamber 301 is installed in the process container 303. An exhaust system similar to the exhaust system of the above-described embodiment is connected to the exhaust port 331.

Figure 10:
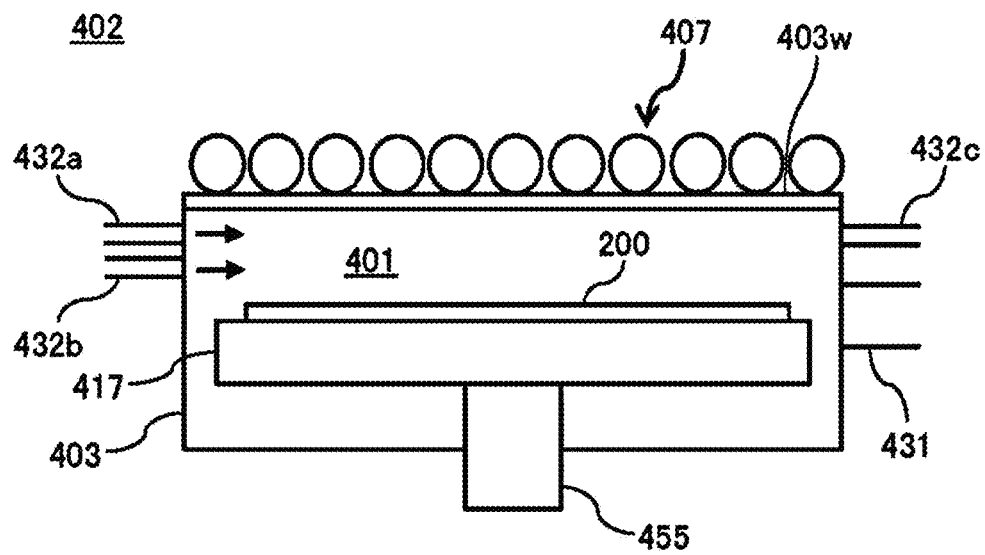
FIG. 10 is a schematic configuration view of a process furnace of a substrate processing apparatus suitably used in a further embodiment of the present disclosure, in which a portion of the process furnace is shown in a vertical cross section.

In addition, for example, the present disclosure may also be suitably applied to a case where a film is formed by using a substrate processing apparatus provided with a process furnace 402 shown in FIG. 10. The process furnace 402 includes a process container 403 forming a process chamber 401, a support base 417 for supporting one or several wafers 200 in a horizontal posture, a rotation shaft 455 for supporting the support base 417 from below, a lamp heater 407 for irradiating light toward the wafer 200 in the process container 403, and a quartz window 403w for transmitting the light irradiated from the lamp heater 407. Gas supply ports 432a to 432c are connected to the process container 403. Gas supply systems similar to the first precursor gas supply system, the second precursor gas supply system and the reaction gas supply system of the above-described embodiment are connected to the gas supply ports 432a, 432b and 432c, respectively. The gas supply ports 432a to 432c are provided on the lateral side of the end portion of the wafer 200 loaded into the process chamber 401. An exhaust port 431 for exhausting the inside of the process chamber 401 is provided in the process container 403. An exhaust system similar to the exhaust system of the above-described embodiment is connected to the exhaust port 431.

Even in the case of using these substrate processing apparatuses, a film-forming process can be performed under the same processing procedures and processing conditions as those of the above-described embodiment and modifications, and the same effects as those of the above-described embodiment and modifications may be obtained.

The above-described embodiments, modifications and the like may be used in combination as appropriate. The processing procedures and processing conditions at this time may be the same as, for example, the processing procedures and processing conditions of the above-described embodiment.

EXAMPLES

Hereinafter, experimental results supporting the effects obtained in the above-described embodiment and modifications will be described.

Example 1

As Example 1, a TiSiN film was formed on a wafer by the sequence shown in FIG. 4 using the substrate processing apparatus according to the above-described embodiment. The processing conditions of the film-forming process were set to predetermined conditions falling within the processing condition range described in the above embodiment.

Figure 11A:
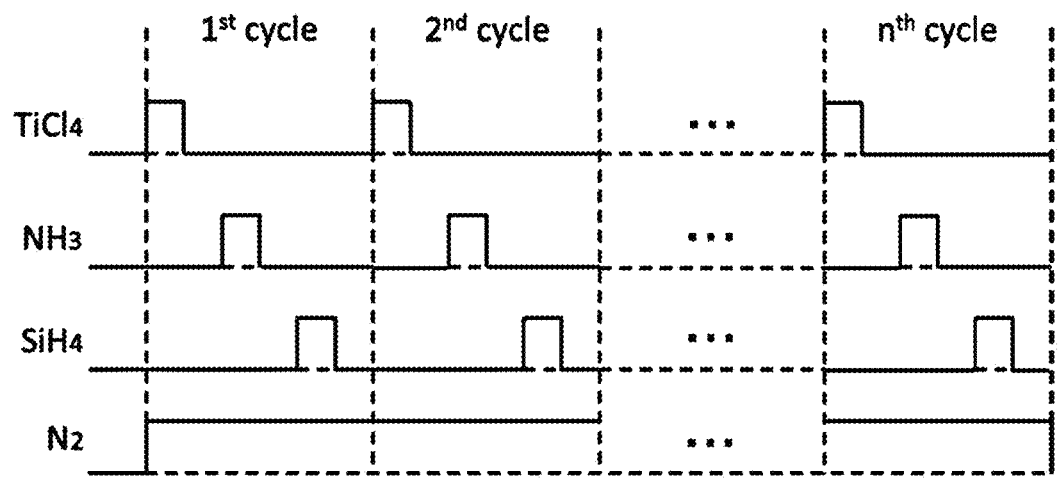
FIGS. 11A and 11B are views showing the timing of gas supply in Comparative Examples.

As Comparative Example 1a, a TiSiN film was formed on a wafer by repeating a sequence shown in FIG. 11A, i.e., a cycle of non-simultaneously and sequentially supplying a $TiCl_4$ gas, an $NH_3$ gas and a $SiH_4$ gas to the wafer.

Figure 11B:
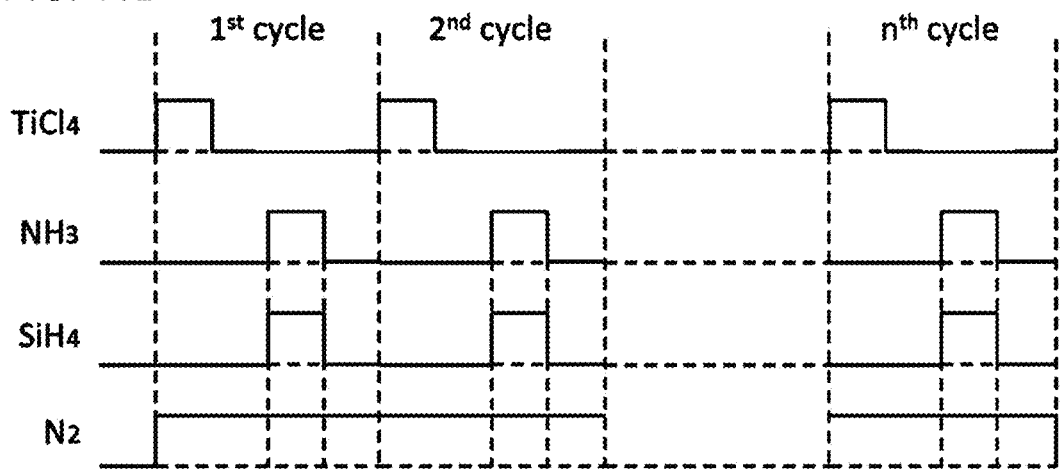

Further, as Comparative Example 1b, a TiSiN film was formed on a wafer by a sequence shown in FIG. 11B, i.e., a sequence of alternately repeating a step of supplying a $TiCl_4$ gas to the wafer and a step of simultaneously supplying an $NH_3$ gas and a $SiH_4$ gas to the wafer.

The composition and the resistivity of each of the TiSiN films formed in Example 1 and Comparative Examples 1a and 1b were measured. The composition was measured by an X-ray photoelectron spectroscopy (XPS) method. FIG. 12A shows the composition and the resistivity of the respective films of Example 1 and Comparative Examples 1a and 1b in a list. According to FIG. 12A, it can be seen that the TiSiN film of Example 1 has no large difference in Ti, N and Si contents as compared with the TiSiN films of Comparative Examples 1a and 1b. Further, it can be noted that the TiSiN film of Example 1 has remarkably low resistivity, i.e., good conductivity as compared with the TiSiN films of Comparative Examples 1a and 1b. This is probably because the TiSiN film of Example 1 has a lower Cl concentration than the TiSiN films of Comparative Examples 1a and 1b. That is, it can be understood that the film formed by the sequence shown in FIG. 4 is a high-quality film having a lower impurity concentration and a higher conductivity than the films formed by the sequences shown in FIGS. 11A and 11B. In addition, it can be noted that the film formed by the sequence shown in FIG. 4 contains substantially the same amount of Si as the film formed by the sequences shown in FIGS. 11A and 11B and, therefore, has substantially the same F barrier function as the film formed by the sequences shown in FIGS. 11A and 11B.

Examples 2a to 2d

As Example 2a, a TiSiN film was formed on a wafer by the film-forming sequence shown in FIG. 4 using the substrate processing apparatus according to the above-described embodiment. As Examples 2b to 2d, a TiSiN film was formed on a wafer by the sequence shown in FIG. 5A using the substrate processing apparatus according to the above-described embodiment. The processing conditions were set to common conditions falling within the processing condition range described in the above embodiment. In Examples 2b to 2d, the supply flow rate of the $SiH_4$ gas continuously supplied after stopping the supply of the $TiCl_4$ gas was set to 0.225 slm, and the supply time thereof was set to 6, 10 and 16 seconds, respectively.

As Comparative Example 2, a cycle of alternately supplying a $TiCl_4$ gas and an $NH_3$ gas to a wafer was repeated to form a TiN film on the wafer.

The composition of each of the films formed in Examples 2a to 2d and Comparative Example 2 was measured by an XPS method. FIG. 12B shows the compositions of the films of Examples 2a to 2d and Comparative Example 2 in a list. According to FIG. 12B, it can be seen that the Cl concentration in the TiSiN films of Examples 2a to 2d is lower than that of the TiN film of Comparative Example 2. In addition, it can be noted that the Cl concentration in the TiSiN films of Examples 2b to 2d is lower than that of the TiSiN film of Example 2a. It can be understood that the Cl concentration in the film decreases as the supply time of the $SiH_4$ gas continuously supplied after stopping the supply of the $TiCl_4$ gas, i.e., the exposure amount of the $SiH_4$ gas to the wafer, increases.

Examples 3a and 3b

As Examples 3a and 3b, a process of forming a TiSiN film on a wafer by the sequence shown in FIG. 5A using the substrate processing apparatus according to the above-described embodiment was performed a plurality of times. The processing conditions were set to common conditions falling within the processing condition range described in the above embodiment. The film thickness was varied within a range of 30 Å to 100 Å each time when the film-forming process is performed. The supply flow rate of the $SiH_4$ gas continuously supplied after stopping the supply of the $TiCl_4$ gas was set to 0.9 slm, and the supply time thereof was set to 6 seconds and 5 seconds in Examples 3a and 3b, respectively.

As Comparative Example 3, a process of forming a TiN film on a wafer by repeating a cycle of alternately supplying a $TiCl_4$ gas and a $NH_3$ gas to the wafer was performed a plurality of times. As in Examples 3a and 2b, the film thickness was varied within a range of 30 Å to 100 Å every time when the film-forming process is performed.

Figure 13:
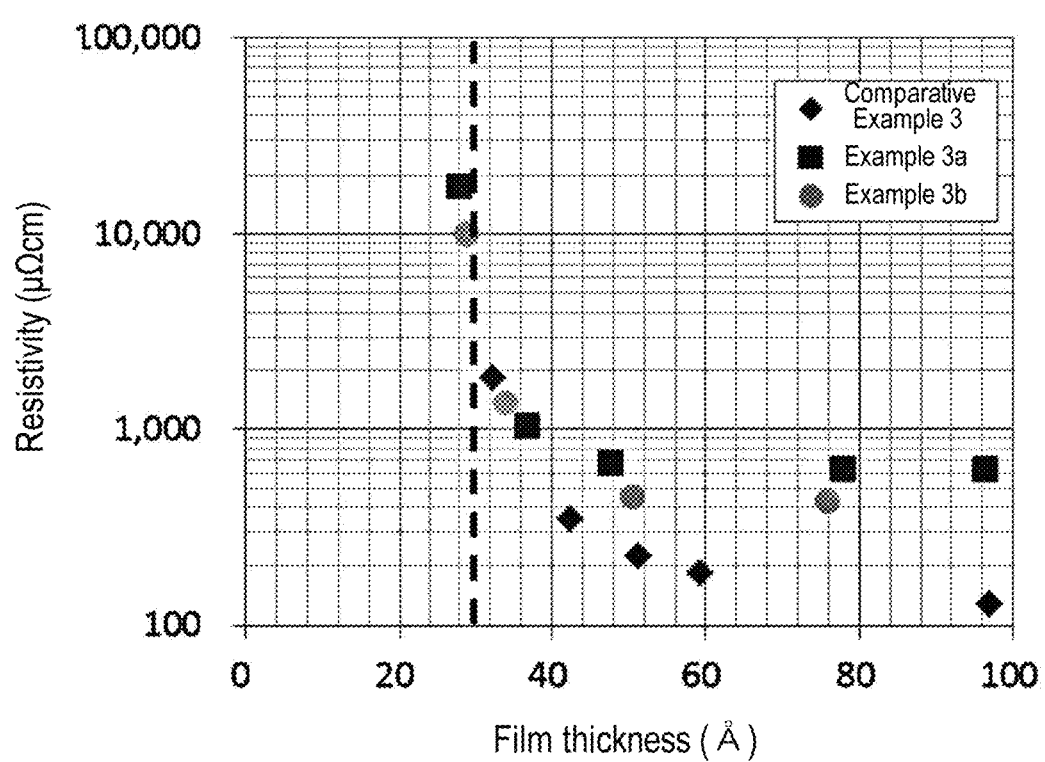
FIG. 13 is a view showing the resistivity of the films formed in Examples and a Comparative Example.

The resistivity of each of the films formed in Examples 3a and 3b and Comparative Example 3 was measured. FIG. 13 shows the results. In FIG. 13, the horizontal axis represents the film thickness (Å), and the vertical axis represents the resistivity (μΩcm). In FIG. 13, marks ■, ● and ◆ indicate Examples 3a, 3b and Comparative Example 3, respectively. According to FIG. 13, it can be seen that the films of Examples 3a and 3b exhibit the resistivity equal to or lower than that of the film of Comparative Example 3 at the film thickness falling within a range of at least 30 to 40 Å.

What is claimed is:

1. A method of manufacturing a semiconductor device, comprising:

forming a conductive film containing a metal element, an additional element different from the metal element, and at least one of nitrogen and carbon, and not containing oxygen, on a substrate by performing a cycle a predetermined number of times, the cycle including non-simultaneously performing:

(a) forming a first layer containing the metal element and the additional element by supplying a first precursor gas containing the metal element and a second precursor gas containing the additional element to the substrate without supplying an oxygen-containing gas to the substrate so that supply periods of the first precursor gas and the second precursor gas at least partially overlap with each other to simultaneously supply the first precursor gas and the second precursor gas to the substrate during the overlapped supply periods; and (b) modifying the first layer to a second layer containing the metal element, the additional element, and the at least one of nitrogen and carbon, and not containing oxygen, by supplying a reaction gas containing the at least one of nitrogen and carbon to the substrate without supplying an oxygen-containing gas to the substrate, wherein during forming the first layer, the supply of the first precursor gas stops prior to stopping the supply of the second precursor gas, and wherein in (a), the second precursor gas is supplied to the substrate at a first flow rate before stopping the supply of the first precursor gas, and the second precursor gas is supplied to the substrate at a second flow rate smaller than the first flow rate after stopping the supply of the first precursor gas.

2. The method of claim 1, wherein in (a), the supply of the first precursor gas and the supply of the second precursor gas start at the same time.

3. The method of claim 1, wherein in (a), the supply of the first precursor gas starts before the supply of the second precursor gas.

4. The method of claim 1, wherein the additional element has a property that an increase in concentration of the additional element in the conductive film enhances an effect of the conductive film for preventing diffusion of fluorine.

5. The method of claim 1, wherein the first precursor gas is a Ti-containing gas containing Ti as the metal element, the second precursor gas is a Si-containing gas containing Si as the additional element, and one of a TiSiN film, a TiSiCN film and a TiSiC film is formed on the substrate.

6. The method of claim 5, wherein the Ti-containing gas further contains at least one selected from a group consisting of Cl, F, Br and I, and the Si-containing gas further contains H.

7. The method of claim 3, wherein in (a), a supply flow rate of the second precursor gas is maintained at the second flow rate after stopping the supply of the first precursor gas.

8. The method of claim 1, wherein in (a), the first precursor gas is supplied to the substrate at a third flow rate before starting the supply of the second precursor gas, and the first precursor gas is supplied to the substrate at a fourth flow rate larger than the third flow rate after starting the supply of the second precursor gas.

9. A substrate processing apparatus, comprising:
a process chamber configured to accommodate a substrate;
a gas supply system configured to supply a first precursor gas containing a metal element, a second precursor gas containing an additional element different from the metal element, and a reaction gas containing at least one of nitrogen and carbon to the substrate accommodated inside the process chamber; and
a controller configured to control the gas supply system so as to form a conductive film containing the metal element, the additional element, and the at least one of nitrogen and carbon, and not containing oxygen, on the substrate by performing a cycle a predetermined number of times, the cycle including non-simultaneously performing:
(a) forming a first layer containing the metal element and the additional element and not containing oxygen by supplying the first precursor gas and the second precursor gas to the substrate accommodated inside the process chamber without supplying an oxygen-containing gas to the substrate so that supply periods of the first precursor gas and the second precursor gas at least partially overlap with each other to simultaneously supply the first precursor gas and the second precursor gas to the substrate during the overlapped supply periods; and
(b) modifying the first layer to a second layer containing the metal element, the additional element, and the at least one of nitrogen and carbon, and not containing oxygen, by supplying the reaction gas to the substrate without supplying oxygen-containing gas to the substrate,
wherein during the forming the first layer, the supply of the first precursor gas stops prior to sopping the supply of the second precursor gas, and
wherein in (a), the second precursor gas is supplied to the substrate at a first flow rate before stopping the supply of the first precursor gas, and the second precursor gas is supplied to the substrate at a second flow rate smaller than the first flow rate after stopping the supply of the first precursor gas.

10. A non-transitory computer-readable recording medium storing a program that causes a computer to have a substrate processing apparatus perform:
forming a conductive film containing a metal element, an additional element different from the metal element, and at least one of nitrogen and carbon, and not containing oxygen, on a substrate by performing a cycle a predetermined number of times, the cycle including non-simultaneously performing:
(a) forming a first layer containing the metal element and the additional element and not containing oxygen by supplying a first precursor gas containing the metal element and a second precursor gas containing the additional element to the substrate without supplying an oxygen-containing gas to the substrate so that supply periods of the first precursor gas and the second precursor gas at least partially overlap with each other to simultaneously supply the first precursor gas and the second precursor gas to the substrate during the overlapped supply periods; and
(b) modifying the first layer to a second layer containing the metal element, the additional element, and the at least one nitrogen and carbon, and not containing oxygen, by supplying a reaction gas containing the at least one of nitrogen and carbon to the substrate without supplying an oxygen-containing gas to the substrate,
wherein during forming the first layer, the supply of the first precursor gas stops prior to stopping the supply of the second precursor gas, and
wherein in (a), the second precursor gas is supplied to the substrate at a first flow rate before stopping the supply of the first precursor gas, and the second precursor gas is supplied to the substrate at a second flow rate smaller than the first flow rate after stopping the supply of the first precursor gas.

* * * * *